United States Patent [19]

Berman et al.

[11] Patent Number: 5,596,372
[45] Date of Patent: Jan. 21, 1997

[54] VIDEO SIGNAL DATA AND COMPOSITE SYNCHRONIZATION EXTRACTION CIRCUIT FOR ON-SCREEN DISPLAY

[75] Inventors: Eric B. Berman, Comack; Philip T. McLaughlin, Huntington, both of N.Y.

[73] Assignee: EEG Enterprises, Inc., Farmingdale, N.Y.

[21] Appl. No.: 383,249

[22] Filed: Feb. 3, 1995

Related U.S. Application Data

[62] Division of Ser. No. 845,734, Mar. 2, 1992, Pat. No. 5,404,172.

[51] Int. Cl.$^6$ ..................................................... H04N 7/08
[52] U.S. Cl. .......................... 348/537; 348/545; 348/536; 348/464
[58] Field of Search ..................................... 348/536, 537, 348/540, 542, 545, 464, 465, 461; 358/148, 158; H04N 7/08, 7/087, 5/04, 5/12

[56] References Cited

U.S. PATENT DOCUMENTS

| | | | |
|---|---|---|---|
| 3,781,695 | 12/1973 | Jackson | 328/155 |
| 4,310,854 | 1/1982 | Baer | 358/143 |
| 4,430,742 | 2/1984 | Milleker et al. | 328/167 |
| 4,449,145 | 5/1984 | Ciciora | 358/147 |
| 4,554,584 | 11/1985 | Elam et al. | 358/165 |
| 4,595,952 | 1/1986 | Filliman | 358/147 |
| 4,595,953 | 6/1986 | Willis | 358/183 |
| 4,620,227 | 10/1986 | Levis | 358/147 |
| 4,633,297 | 12/1986 | Skerlos et al. | 358/22 |
| 4,647,974 | 3/1987 | Butler et al. | 358/185 |
| 4,667,235 | 5/1987 | Nozoe et al. | 358/147 |
| 4,698,677 | 10/1987 | Kinghorn et al. | 358/147 |
| 4,701,794 | 10/1987 | Froling et al. | 358/147 |
| 4,719,510 | 1/1988 | Kinghorn | 358/147 |
| 4,725,886 | 2/1988 | Galumbeck et al. | 358/147 |
| 4,731,587 | 3/1988 | Jensen | 328/167 |
| 4,739,402 | 4/1988 | Maeda et al. | 358/147 |
| 4,803,680 | 2/1989 | Rokugo et al. | 375/120 |
| 4,829,569 | 5/1989 | Seth-Smith et al. | 380/10 |
| 4,837,620 | 6/1989 | Harvey | 358/142 |
| 4,845,662 | 7/1989 | Tokumitsu | 364/900 |
| 4,849,818 | 7/1989 | Hartmann et al. | 358/142 |
| 4,857,999 | 8/1989 | Welsh | 358/84 |

(List continued on next page.)

FOREIGN PATENT DOCUMENTS

| | | | |
|---|---|---|---|
| 0106286 | 7/1982 | Japan | 358/147 |
| 0090478 | 5/1984 | Japan | 358/142 |
| 0134564 | 7/1985 | Japan | 358/158 |
| 0248085 | 12/1985 | Japan | 358/147 |
| 0023284 | 1/1987 | Japan | H04N 5/12 |
| 1523307 | 8/1978 | United Kingdom | 307/358 |

*Primary Examiner*—David E. Harvey
*Attorney, Agent, or Firm*—Martin Novack

[57] ABSTRACT

A composite synchronization extraction circuit is particularly suited for receiving composite video signals containing closed captioning data in raster scan line 21 by means of a signal CMOS integrated circuit device. A dual mode voltage clamp is realized in CMOS technology. The clamp includes temperature compensated current sources in the form of complementary current mirrors through which a clamped composite synchronization node of is charged and discharged, the output of which controls a transistor for charging the composite synchronization node. Detected pulse amplitude is set by slicing the incoming pulse at the back porch level and then doubling the amplitude with an amplifier and comparing that level with the back porch level as derived from a sample-and-hold device. The slice voltage level is maintained without an off-chip capacitor by an analog-digital-analog conversion process. Frequency and phase synchronization is accomplished by a combination of frequency lock loop and phase lock loop working in concert to generate a control voltage for a voltage controlled oscillator in a flywheel mode. The voltage controlled oscillator is not subject to noise in the incoming signal and provides a clean source of timing information for the circuit. The effects of impulse noise in the detection of the vertical retrace pulse are eliminated by the use of digital counting circuits to count the requisite number of horizontal synchronization pulses which occur between valid retrace pulses and to block pulses which appear at other times.

8 Claims, 16 Drawing Sheets

U.S. PATENT DOCUMENTS

| | | | |
|---|---|---|---|
| 4,890,321 | 12/1989 | Seth-Smith et al. | 380/20 |
| 4,894,714 | 1/1990 | Christis | 358/86 |
| 4,894,789 | 1/1990 | Yee | 364/521 |
| 4,908,706 | 3/1990 | Bugg | 358/147 |
| 4,908,707 | 3/1990 | Kinghorn | 358/147 |
| 4,910,595 | 3/1990 | Bugg et al. | 358/147 |
| 4,912,555 | 3/1990 | Van Gestel | 358/147 |
| 4,931,870 | 6/1990 | den Hollander | 358/142 |
| 4,933,764 | 6/1990 | Kinghorn | 358/142 |
| 4,933,959 | 6/1990 | Knechtel | 375/120 |
| 4,954,882 | 9/1990 | Kamemoto | 358/22 |
| 4,977,455 | 12/1990 | Young | 358/142 |
| 4,991,017 | 2/1991 | Raaijmakers | 358/147 |
| 4,991,018 | 2/1991 | Davies | 358/147 |
| 4,992,871 | 2/1991 | Bensch et al. | 358/142 |
| 4,999,706 | 3/1991 | Kinghorn | 358/147 |
| 5,003,390 | 3/1991 | Helgert et al. | 358/142 |
| 5,008,750 | 4/1991 | Gomikawa | 358/147 |
| 5,010,499 | 4/1991 | Yee | 358/86 |
| 5,012,338 | 4/1991 | Davis | 358/147 |
| 5,019,907 | 5/1991 | Murakoshi et al. | 348/542 |
| 5,023,721 | 6/1991 | Moon-Hwan | 358/147 |
| 5,038,212 | 8/1991 | Van Den Hombergh et al. | 358/142 |
| 5,045,941 | 9/1991 | Davies | 358/147 |
| 5,052,031 | 9/1991 | Molloy | 375/120 |

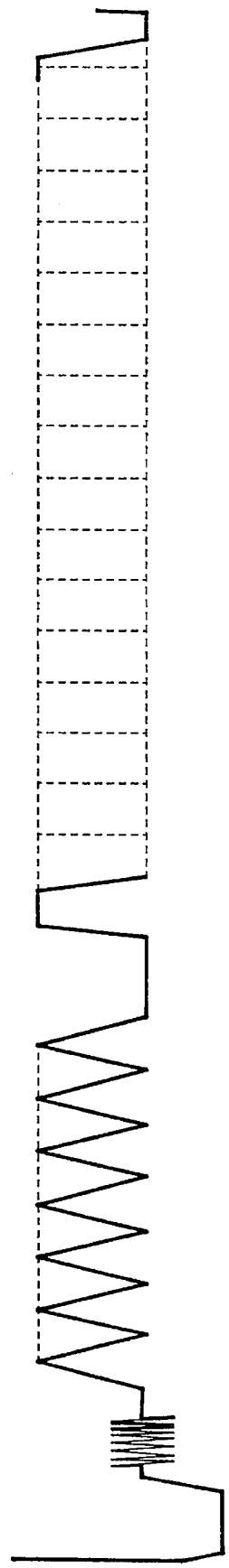

VIDEO SIGNAL DATA AND COMPOSITE SYNCHRONIZATION EXTRACTION CIRCUIT FOR ON-SCREEN DISPLAY

This is a divisional of U.S. application Ser. No. 07/845,734 filed Mar. 2, 1992 now U.S. Pat. No. 5,404,172.

TECHNICAL FIELD

The invention relates generally to circuits for recovering and processing certain portions of a video signal and relates particularly, but not exclusively, to the extraction of timing and data information from a composite video signal for providing on-screen display of closed-caption or text information.

BACKGROUND OF THE INVENTION

Television receiver regulations in the United States call for future television receivers to be able to process signals which contain information in encoded data format within line 21 of the scanned television raster, referred to as "line 21 information," from which there may be generated a display of closed captioning information (Federal Communications Commission Report and Order on GEN Docket No. 91-1, dated Apr. 12, 1991). The data contained in raster line 21 may be video related, in which case it is referred to as "captions", or non-video related, in which case it is referred to as "text".

In order for a television receiver to make use of the line 21 information, it is necessary to locate the signal portion representing raster line 21 containing the data, to extract the data, to decode it, and to transform it into the appropriate alphanumeric characters, which are then incorporated into the demodulated video signal for display on the screen. The proper recovery, identification, and placement of the characters on the screen requires accurate timing and synchronization with the horizontal and vertical timing of the composite video signal and therefore makes necessary a stable timing reference and a highly accurate extraction of timing information from the incoming composite video signal.

Television video waveforms, called "composite video," contain horizontal, vertical, and field synchronization information, along with the picture information. FIG. 1 is an example of such a composite video signal. The synchronization information portion of the waveform, which includes both horizontal and vertical synchronization is referred to as "composite synchronization." A schematic example of a horizontal interval waveform 11, labeled as such, is illustrated in greater detail in FIG. 1a.

A serious difficulty in the extraction of composite synchronization from a composite video signal is that such signals as are available in a television receiver frequently contain considerable extraneous noise, particularly impulse noise. In addition, the signal amplitudes may vary widely. A receiver system which is able to respond properly to such varying amplitudes is referred to as being "adaptive."

The composite synchronization can be extracted from the composite video by means of a voltage clamping circuit, or "clamp", and a voltage comparator. The most negative part of the video waveform, referred to as the "synchronization tip", or "sync tip" is caused by appropriate electronic circuits to be set, or "clamped" to a reference voltage, so that all of the synchronization tips, or at least the average voltage of the synchronization tips in the case of a noisy signal, are set to this clamping voltage level shown in FIG. 1b in relation to other voltage features of the signal. A second reference is chosen to be at a higher voltage than the clamping voltage and preferably at a level exactly halfway between the clamping level and the level of the back porch voltage. This second voltage level is called the "slice level." If the video waveform is applied to the positive input of a voltage comparator and the slice level voltage is applied to the negative input of the voltage comparator, as shown in FIG. 1c, then whenever the video waveform voltage is more positive than the slice level, a positive voltage appears at the output of the comparator. Conversely, when the video waveform voltage is more negative than the slice level, a negative voltage appears at the output of the comparator. The resulting output of the comparator is a "squared-up" version of the lower portion of the video waveform and is what is considered the composite synchronization, as shown in FIG. 1d.

While the timing signal pulses normally are easily distinguished by the comparator from the remainder of the composite video signal, this process is vulnerable to signals with noise added. Additional difficulties with existing video signal timing extraction circuits which are addressed by the present invention will also be discussed below.

The extraction of the data which has been encoded into the television raster line 21 requires several operations. Typically, along with the data itself, there is also included information about the bit, or clock rate and the byte boundaries. The recovery process requires that the internal clock be synchronized to the transmitted bit rate, that the timing of the byte boundaries be established, and that the proper slicing level be set to enable the recovery of data even under adverse conditions of signal level deterioration and noise. The synchronization of the internal clock timing to the transmitted bit rate clock timing constitutes a timing recovery process referred to as "data clock recovery". The two clocks are usually at the same frequency, but they must be brought into a mutual phase lock condition, so that the extraction circuits can sample the sliced data at the optimum time to achieve the optimum data recovery in a noisy environment.

The video signal input to the data recovery circuits is usually already clamped by the previous circuit action. The establishing of the slice level for use in the voltage comparator for extracting the data is more difficult than it is in the synchronization recovery process, however, because the data occurs infrequently, once per television frame, and for only short periods of time during line 21. Good data recovery depends on an adaptive data slice level which can adjust quickly to variations in data amplitude in a given line 21 while also being able to hold the slice level between successive frames. Although circuits have been devised which perform these functions, the additional requirement that such a circuit perform well within an integrated CMOS environment adds serious complications. There is a need for a sample-and-hold circuit which performs all the needed functions without the need for components external to the circuit chip which are normally required.

The internal timing signals needed to perform all of the processing for data recovery and display, also referred to as the video "dot clock," are derived from a single, stable, high frequency timing source reference. This stable timing reference is normally a VCO (voltage-controlled oscillator) whose frequency is established by a crystal or by other stable discrete components and which is then phase-locked to the composite video synchronization signal. This timing reference is used in the data extraction phase and also in generating jitter-free characters for display. The requirements for achieving such a stable VCO are easily met in a discrete environment, but are usually difficult to achieve in an integrated circuit whose designing involved the primary objectives of minimum size and minimum number of lead connections. There is therefore a need for a circuit which provides the required VCO performance within a CMOS environment.

SUMMARY OF THE INVENTION

The novel extraction circuit in accordance with the present invention includes the following features:

A novel means is provided for generating a stable timing reference using a minimum number of external terminals and requiring only relatively non-critical components to accurately establish the operating frequency.

The basic VCO is implemented by means of a simple ring oscillator consisting of an odd number of inverting stages and using no external components. In a CMOS environment, the fundamental operating frequency is determined by the number of stages in the ring and the propagation delay of each stage. This results in a minimum configuration implementation. However, the operating frequency is not precisely determined. The VCO is brought into the desired operating frequency range by a frequency steering circuit which compares the divided VCO frequency to a second timing signal which is approximately equal to the horizontal timing of the input composite video. This second timing signal may be supplied from the outside (off-chip) or generated internally (on-chip), either by hardware or by software, using the on-board cpu (central processor unit).

The divided VCO signal is part of an internal timing pulse generator chain which produces outputs locked in phase to both the horizontal and vertical timing signals of the incoming video signal. These noise-free "flywheel" timing signals are used as the source of timing information for the remainder of the circuit, thus virtually eliminating the effects of noise in the input signal. The "lock" to the vertical timing is essential to finding the raster line portion of the television signal containing the data and also provides a novel ability to detect a change in the television channel without having available a signal from the receiver's tuner circuits.

A dual clamp system incorporating a superior diode clamp for initially clamping the synchronization level and then switching to a Gated Clamp provides good noise immunity. Proper startup of the circuit is assured by the use of a first clamp which is independent of timing information for its operation, but which is subject to noise, and subsequent switching to a second clamp which is dependent upon timing information as derived with the use of the first clamp, but which is substantially immune to noise.

A novel means establishes an adaptive synchronization slice level with high noise immunity, using a stable "times 2" amplifier. The extraction of the timing signal is controlled by a novel slicing circuit in which the input signal is sampled at the back porch voltage level and this level is then compared to the composite video signal, which has been doubled in amplitude. This guarantees the establishment of the slice level at the middle of the synchronization amplitude, independently of the input amplitude.

A novel data recovery system uses a closed-loop digital phase adjustment technique for clock recovery and a sample-and-hold technique for establishing the slice level. The data slice level reference voltage establishing and retaining circuit makes use of a combination of a digital encoder and decoder in conjunction with a voltage comparator to eliminate the need for a large, high quality, off-chip capacitor. Such a capacitor would contribute to leakage problems, due to the low duty cycle nature of the signal.

These and other features of the invention will be discussed below in more detail.

BRIEF DESCRIPTION OF THE DRAWINGS

FIG. 3b is a timing diagram describing the operating characteristics of the gated clamping circuit of FIG. 3a.

DETAILED DESCRIPTION

In order to facilitate the below discussion, reference is made to FIGS. 1 and 1a of the drawings. There is shown in FIG. 1a a pictorial representation of that portion of a composite video signal 1a1 representing a single horizontal line. It begins with a horizontal synchronization pulse 1a2 including the front and back porches appearing below a black level voltage 1a3. The interval above the horizontal synchronization pulse 1a2 represents the horizontal blanking interval 1a3. The voltage level at the upper right-hand shoulder of the horizontal synchronization pulse 1a2 is referred to as the "back-porch" voltage level 1a4. After the horizontal synchronization pulse 1a2, comes a color burst 1a5 for color synchronization, followed by the video content portion in the form of both luminance and color information in an overlay as a composite signal 1a6.

The various features of video signals themselves, as well as the structual nature and operating characteristics of circuitry for receiving them, including extraction circuits, are by now well known in the art for both vacuum tube and transistor technologies. Therefore, the specifics of such known circuits will not be needlessly discussed. Moreover, since modern integrated circuits are largely designed in functional subcircuit cell form with the internal hardware details being provided by means of CAD (computer assisted design) systems, the circuits herein will be represented largely in functional block form. However, where novel circuit features are involved, such features will be particularized to the extent considered necessary for permitting a person skilled in the art to adapt them for use in a suitable circuit for practicing the present invention.

Figure 1:
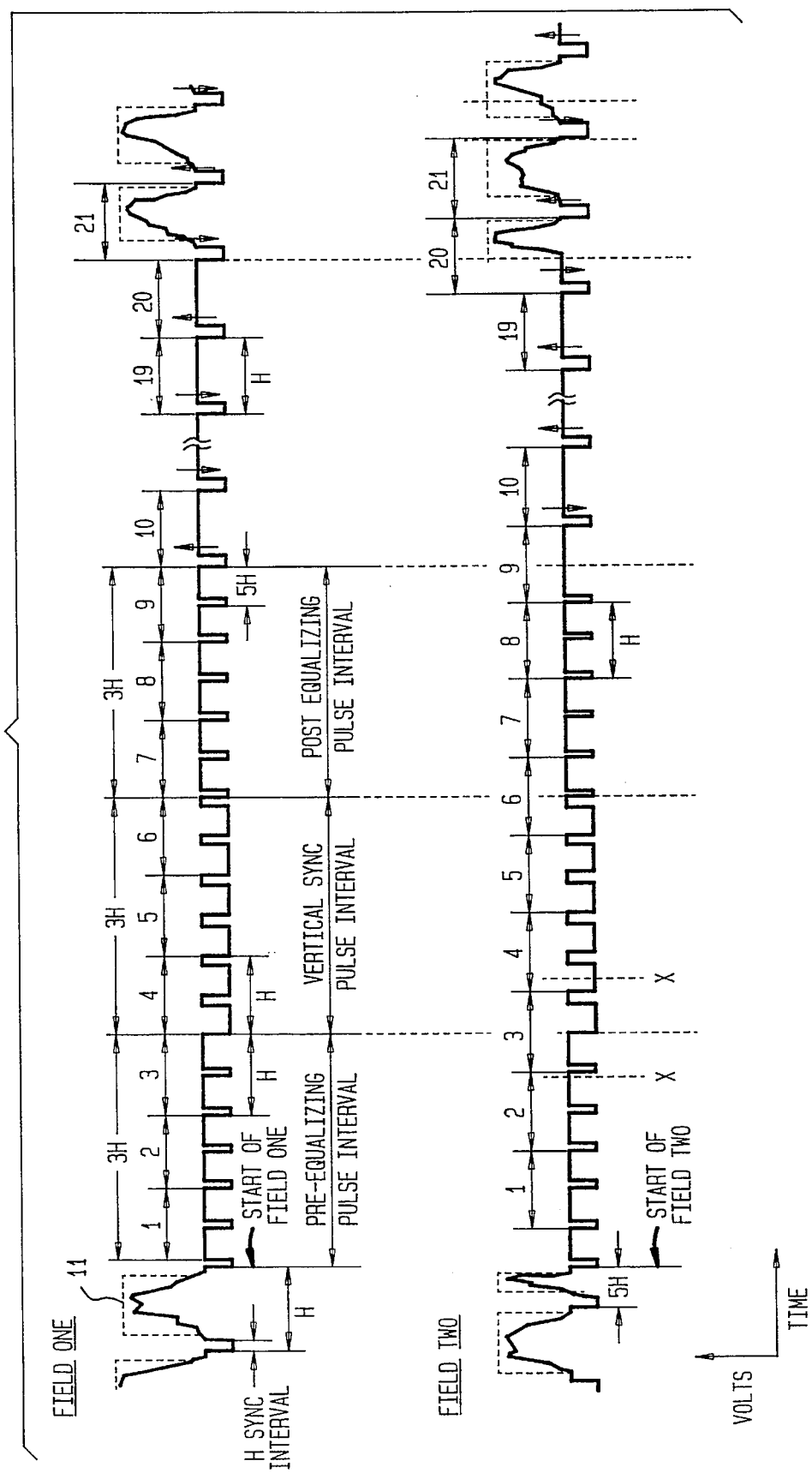
FIGS. 1 through 1d are exaggerated, schematic prior art representations of various aspects of waveforms of a composite video transmission signal in various stages of signal processing.
Figure 1A:
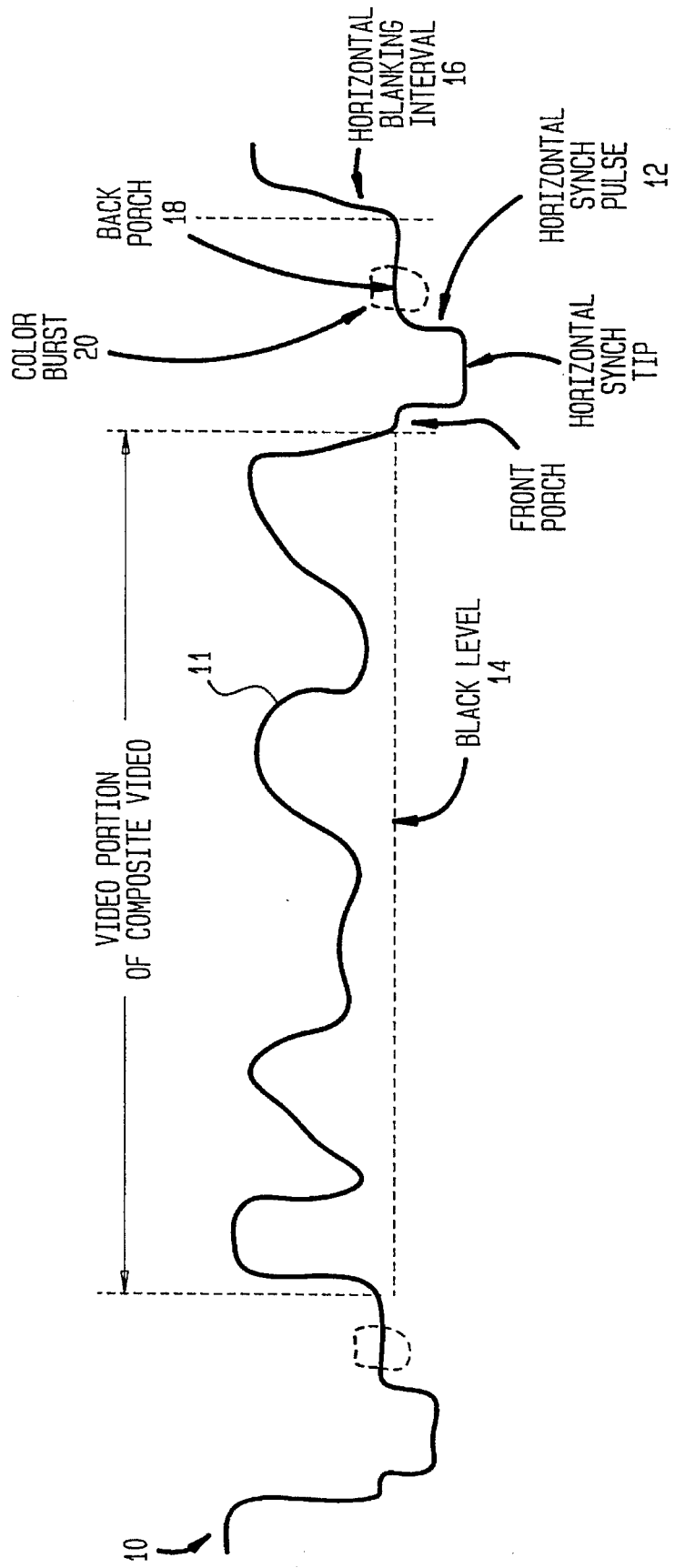
FIG. 1e is a schematic representation of the signal waveform of the raster line 21.
Figure 1B:
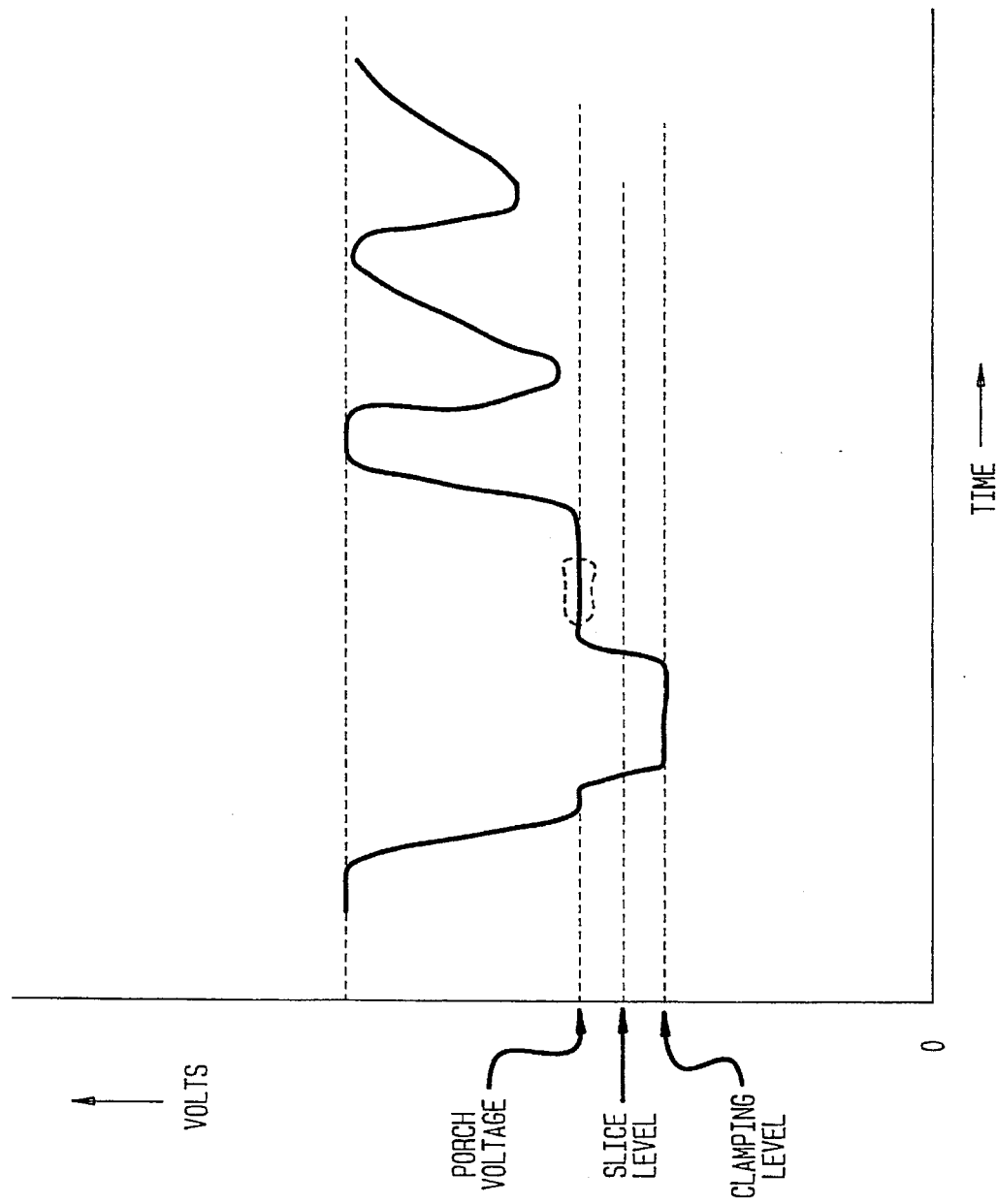

Referring now to FIG. 1, that portion of the signal which encompasses raster lines 1 through 21 constitutes the vertical blanking interval. Two fields comprise a complete frame. The odd field is defined as the field which begins on a horizontal line boundary, while the even field starts in the middle of a horizontal line. The vertical blanking interval starts with three horizontal line periods of synchronization pulses at twice the normal horizontal rate, called the "preequalizing" pulses. This is followed by another three-horizontal-line period of broad pulse with synchronizing serrations, called the "vertical pulse period". The following three-horizontal-line period also contains 2 h synchronization pulses called the "post-equalizing pulses". The remainder of the vertical blanking interval consists of normal horizontal synchronization pulse periods which do not contain any video picture information. The last line of the vertical blanking interval in the odd field is line 21. In the even field, only the first half of line 21 is within the vertical blanking interval.

FIG. 1e shows the closed captioning waveform normally transmitted within line 21 of the odd field. Following the standard horizontal synchronizing interval and the color burst is a period of seven clock cycles, a period of zero level, and then a period of 17 pulses at twice the rate of the seven clock pulses. The first of these 17 pulses is always present, but the remaining 16 pulses are transmitted as two eight bit data bytes using the ASCII code, with odd parity for the data desired.

It need hardly be stated that such video signals and various types of circuit hardware for extracting information from them are by now well known in the art for both vacuum tube and transistor technologies. Therefore, the specifics of such known circuits need not be discussed, and the circuits will be represented herein largely in functional block form. However, where novel circuit features are involved, such features will be particularized to the extent considered necessary for permitting a person skilled in the art to adapt them for use in a suitable circuit for practicing the present invention.

GENERAL CIRCUIT FEATURES

Figure 2:
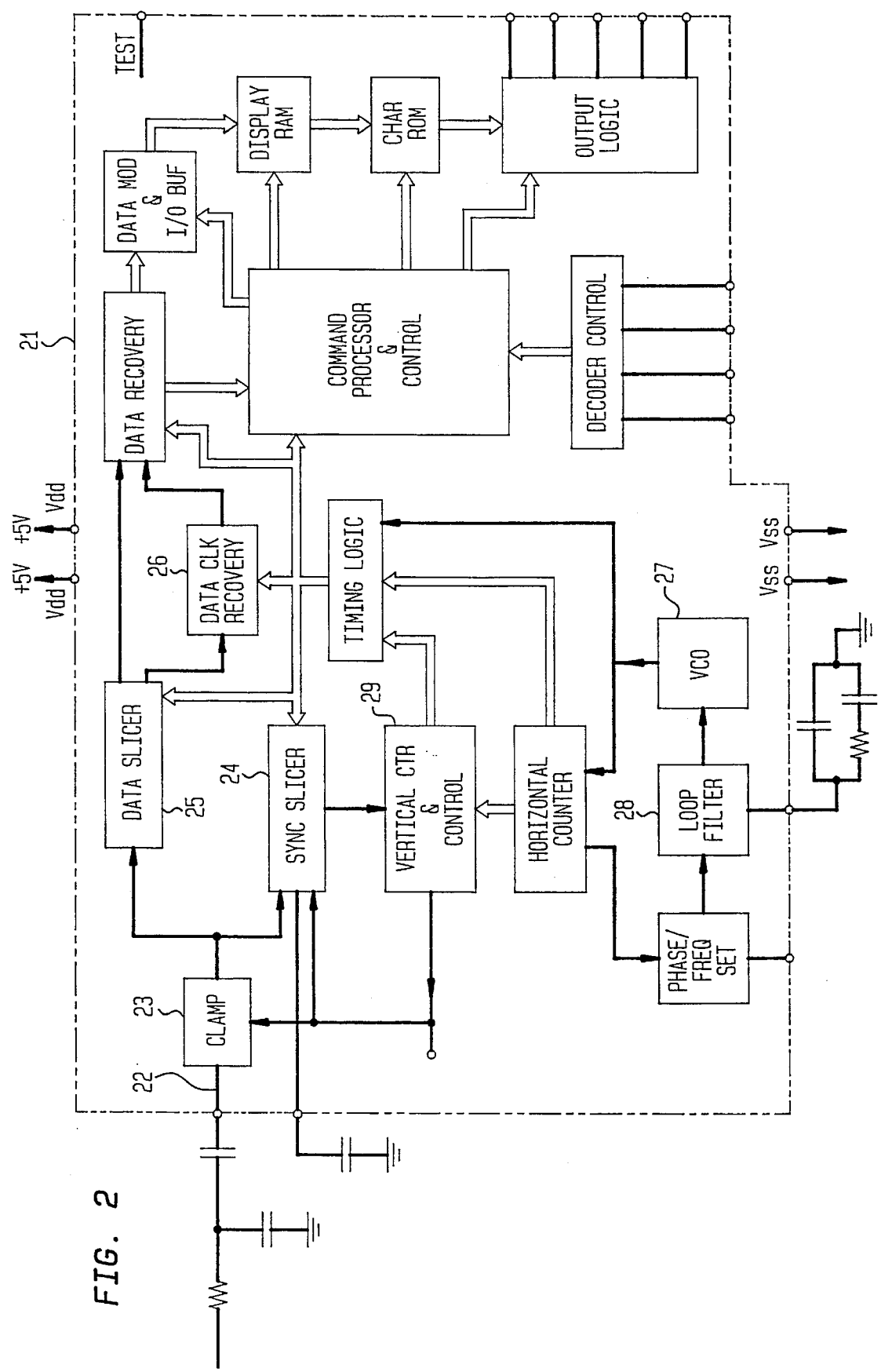
FIG. 2 is a circuit diagram in block form of composite video signal processing circuits for timing and data extraction and processing in accordance with one embodiment of the invention.

FIG. 2 shows in signal flow chart form the architecture of a video signal timing and data recovery and processing circuit 21 in accordance with one embodiment of the invention. An important practical aspect of the circuit 21 which should be noted is that it is particularly well suited for realization in CMOS (COMPLEMENTARY METAL-OXIDE-SEMICONDUCTOR) technology. This is of special significance because the nature of the task of decoding the captioning data in the video signal and generating the corresponding characters for display on the screen calls for both analog and digital processing functions. The digital functions are best carried out by a CMOS device. By making the analog functions also realizable in this technology, the entire set of functions may then be incorporated in a single integrated circuit chip, thus significantly reducing the cost, size, and power requirements. In this regard, CMOS technology presents some particularly challenging practical problems. There are relatively wide variations in the values associated with individual components from wafer-to-wafer in the CMOS manufacturing process. In order to accommodate such variations, the novel extraction circuit 21 includes a number of sub-circuits especially adapted to the CMOS environment, but also capable of being adapted for applications in other technologies.

Most transistors referred to below are in the form of complementary pairs, as is well understood in the CMOS design art. Conventional symbols are used to indicate whether they are P-type or N-type conduction channel devices. P-type devices have their source on the positive voltage side, while N-type devices have their source on the negative voltage side. Since the drawings show the interconnection of the devices in a manner which would make the realization of the circuits readily apparent to one skilled in the art, such connections will not be further cataloged in detail, but will instead be discussed functionally. Reference to a transistor being connected "between" two points means that the source and drain are connected to the points as appropriate, taking into consideration the conduction channel type of the transistor.

Of particular interest in the circuit 21 of FIG. 2 are the video input node 22 and the functional blocks identified as the CLAMP 23, the SYNC SLICER 24, the DATA SLICER 25, the DATA CLOCK RECOVERY 26, the VCO 27 and LOOP FILTER 28, and the VERTICAL COUNTER AND CONTROL 29, and the. In accordance with the present invention, the functions of these blocks are provided by means of novel circuits as discussed below in terms of functional categories.

DIODE CLAMP

Figure 3:
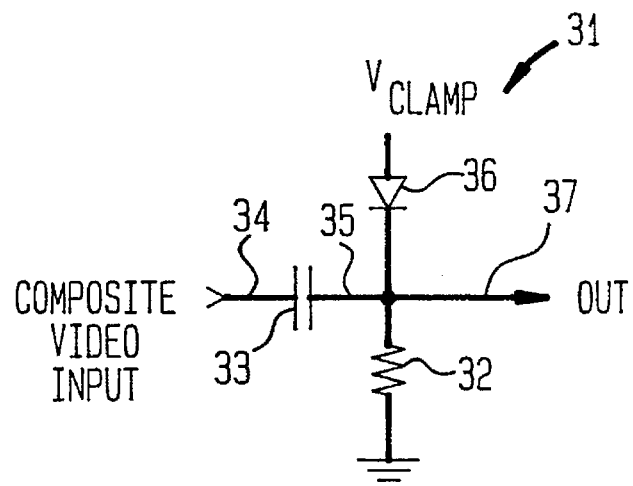
FIG. 3 is a schematic circuit diagram of a diode clamping circuit of the type found in the prior art.

Referring again to FIG. 2, the first function to be performed on the signal 21 by the extraction circuit 21 is to clamp the voltage to approximately 1 volt above ground potential by a clamp 23. "Ground potential" in this context means a reference voltage in the circuit 21 which is nominally at 0 volts, and does not necessarily mean earth ground potential of the associated equipment. The clamping function is normally carried out in the prior art by a diode clamp 31 and resistor 32 as shown in FIG. 3. The diode clamp 31 consists of a capacitor 33 having an input side 34 connected to the incoming signal, while the other side 35 is connected to a d.c. (direct current) restoring resistor 32 and is also connected to the clamping voltage Vclamp by a reverse polarity diode 36. It can be seen that the clamped video node 37 of the capacitor 33, which is the video output, will be maintained by the diode 36 at the clamping potential, which is at a level below Vclamp by reason of the voltage drop across the diode 36.

REFERENCE VOLTAGE CLAMP

One problem associated with the prior art diode clamp is that CMOS technology does not lend itself to the formation of diodes in the circuit. A second is that the current capability of diodes is more limited than would be desirable for the response time needed at the node 37 for this application. A third is that diodes generally have temperature-dependent forward current characteristics and leakage current. The effect of such temperature dependence of the charging and discharging currents of the composite synchronization node 37 can result in output signal distortion by changing the slope of the edges of the composite synchronization output signal.

Figure 3A:
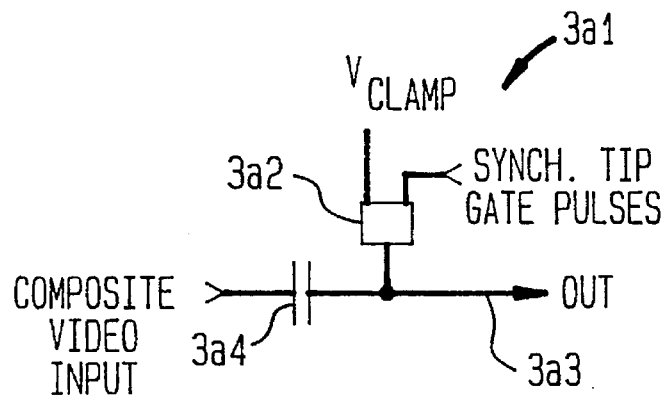
FIG. 3a is a schematic circuit diagram of a gated clamping circuit of the type found in the prior art.
Figure 4:
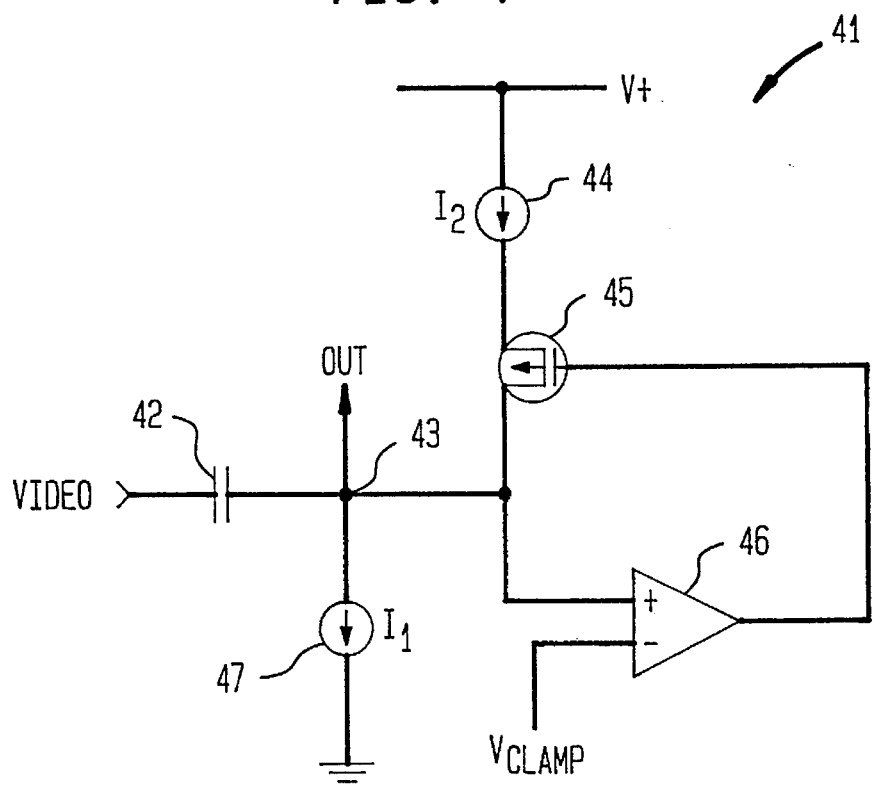
FIG. 4 is a schematic circuit diagram of a novel reference voltage clamping circuit of the circuit of FIG. 2.

In order to address the above-remaining problems associated with the clamping function, there is provided in the extraction circuit 21 a novel form of the clamp 23, the function of which is similar to that of a diode clamp. The novel clamp is shown as clamp 41 in a schematic diagram of the circuit of the clamp in FIG. 4. The circuit will be referred to as a Reference Voltage Clamp, or "RVC". The clamp 41 also features a capacitor 42 and a composite video output node 43, similar to that of the above-referenced diode clamp 31 of FIG. 3a. However, instead of a diode, there is provided a charging current source 44 and a P-type charging transistor 38 connected in series between the output side of the capacitor 42 and a positive voltage rail V+. A comparator 46 has its positive input connected to the output node 43, its negative input connected to the clamping voltage Vc, and its output connected to the gate of the transistor 45. A second discharging current source 47 is connected between the node 43 and ground potential. It can be seen that in operation, discharging current source 46 draws the node 43 down in voltage by discharging the capacitor 42 until the voltage on node 43 is lower in voltage than the clamping voltage Vc. When the video synchronization tips are lower in voltage than the clamping voltage Vc by an amount that is greater than the threshold of the voltage comparator 46, then the comparator 46 output changes state and applies to the gate of the P-type transistor 45 a voltage to turn it on and bring the voltage of the node 43 back up to the clamping voltage Vc. The charging current source 44 has a current capacity which is greater than that of the discharging current source 46 by the factor of the inverse ratio of the synchronization tip time duration to the horizontal line time and draws the video line up in voltage, overcoming the effects of the discharging current source 46 and charging the capacitor 42 until the voltage of the node 43 is greater than the clamping voltage Vc, thus changing the state of the voltage comparator 46 to turn off again the transistor 45. This permits the discharging current source 46 to draw the node 43 down again to repeat the process. As integrated over time, this process clamps the video synchronization tips to the clamping voltage Vc.

The advantages of the above novel CMOS clamping arrangement are that; 1. It does not require a diode; 2. It does not draw current from the clamping voltage reference; 3. The clamping voltage differential is small, essentially the input threshold of the voltage comparator; 4. Only very small temperature effects are present; and, 5. The current carrying capability of the current sources 44 and 46 and the transistor 45 are relatively high, thus permitting a fast response time. Additionally, the current sources 44 and 46 may readily be constructed to offer temperature-compensated operation.

IMPROVED GATED CLAMP

Figure 3B:
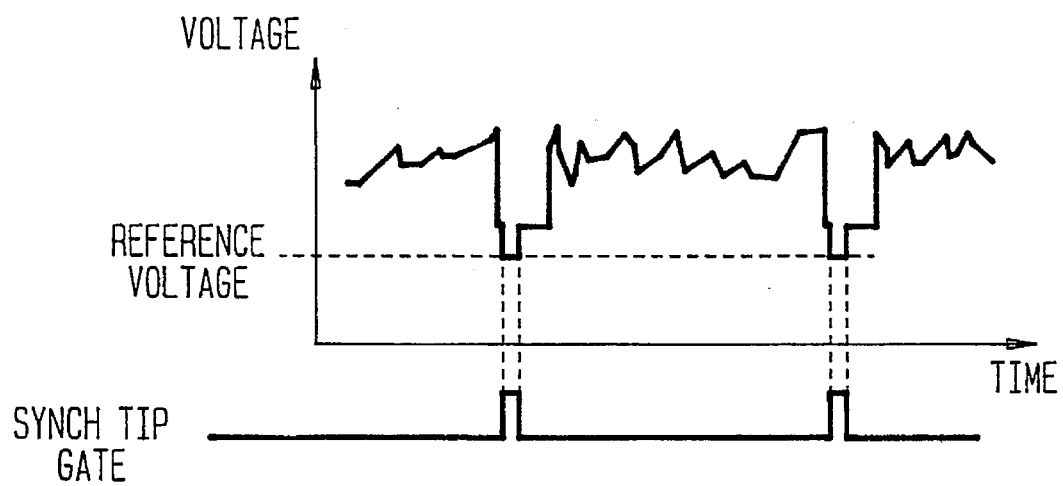
Figure 3C:
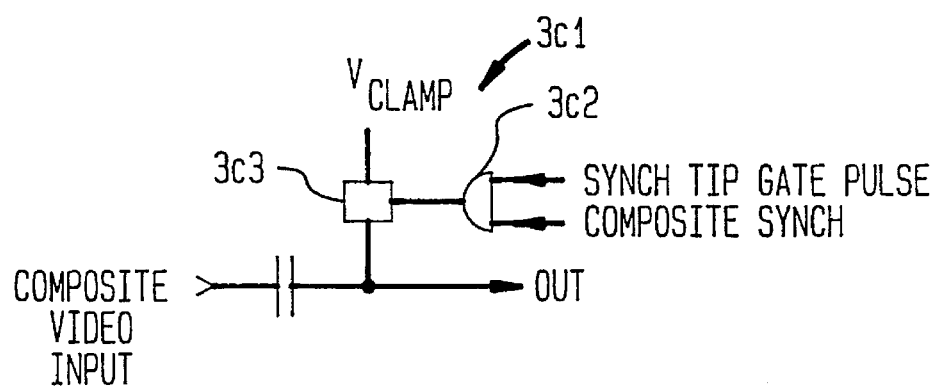
FIG. 3c is a schematic circuit diagram of a novel gated clamping circuit useful in the circuit of FIG. 2.

It is desirable that the clamping function be relatively immune to the imperfections in the video waveform caused by noise in the video signal. One way to improve such immunity is to limit the operation of the clamp to only intervals during which the synchronization pulse is present. This can be achieved by means of an electronic switch which is enabled at the horizontal synchronization rate by the synchronization tip gate pulses, as is the case for the prior art Gated Clamp circuit 3a1 of FIG. 3a, which has its operation related to the signal timing as is illustrated graphically in FIG. 3b. The Gated Clamp 3a1 works on the principle that a "gate" pulse, derived from the synchronized clock, having the proper width and position in time is applied to an electronic switch 3a2 placed between the reference voltage Vc and the clamped video output lead 3a3. When the synchronization tip is present and the switch 3a2 is closed via the gating pulse, and if the video synchronization tip voltage is different from the reference voltage Vc, an adjustment current will flow to or from the reference voltage source V to adjust the charge on the capacitor 3a4 through the video source. When the capacitor 3a2 is sufficiently charged, which process may require the passing of several synchronization tips, the video synchronization tip will be essentially at the same value as the reference voltage and is then considered to be clamped to the reference voltage. Between synchronization tip gate pulses, the clamped video lead will essentially "float," and the capacitor 3a2 will charge or discharge, depending upon several factors. The capacitor 3a2 charge will be restored by succeeding synchronization tip pulses. The Gated Clamp circuit 3a1 can fail to operate properly with video signals that have anomalies in the horizontal and/or vertical synchronization pulses. For example, there may be missing pulses in non-standard video or during high impulse noise conditions. Also, the synchronization pulses may be displaced in time by VCR tape stretching. In any case, if the synchronization tip is not present when the gate pulse arrives, then the circuit will attempt to clamp at an erroneous video level. The novel circuit of the improved Gated Clamp 3c1 shown in FIG. 3c eliminates the erroneous clamping action without sacrificing the other advantages of a gated clamp. This improvement is accomplished by AND'ing the gate pulse with the composite synchronization pulse in the AND gate 3c2. This enables the switch 3c3 at the proper time, only if the synchronization pulse will be sampled, thus insuring that an erroneous level can never be sampled.

DUAL MODE CLAMP

A problem arises with the above Gated Clamp 3a1 in that it may not start up properly, since composite synchronization is needed to obtain the synchronization tip gates and since proper clamping and slicing are needed to obtain the composite synchronization. This problem is eliminated by the introduction of a novel dual-mode system for the clamp 23 of FIG. 2 which includes both an RVC clamp for starting up independently of the timing information and an improved Gated Clamp which is switched in to replace the function of the RVC clamp after start-up, when there is sufficient timing information to supply the appropriate synchronization tip gates for operating the gate switch.

Figure 5:
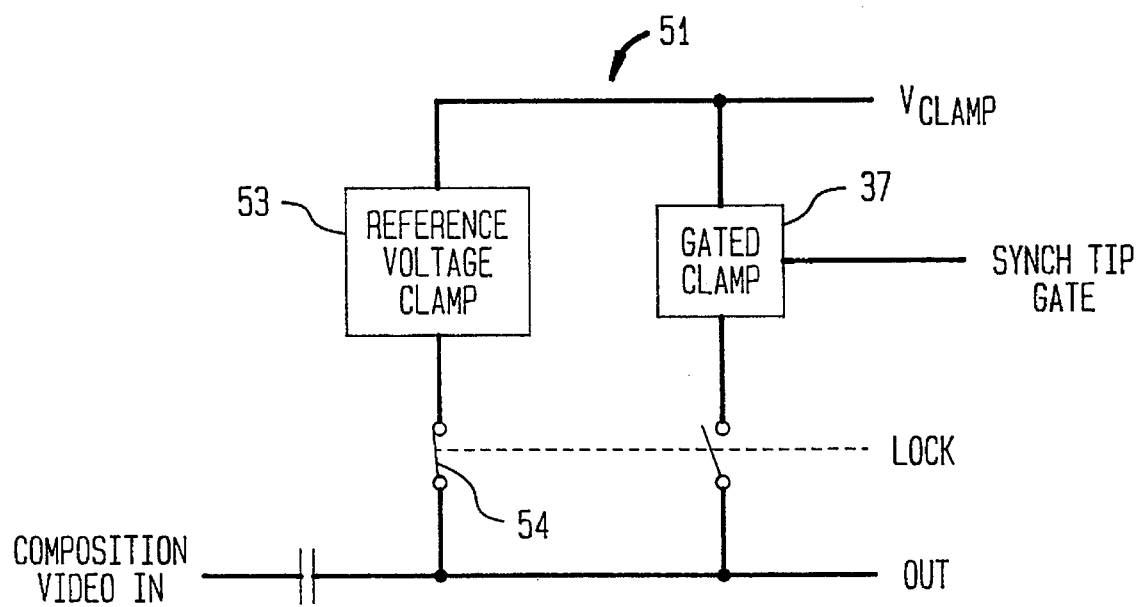
FIG. 5 is a schematic representation of a novel dual-mode clamping circuit useful in the circuit of FIG. 2.

FIG. 5 depicts the novel dual-mode clamp 51. Composite video is fed to the circuit via a capacitor 52 and is clamped to the clamping voltage Vclamp via a Reference Voltage Clamp 53 through electronic switch 54 and provides clamped video for signal processing. When synchronization is acquired and acknowledged, a switch control 55 causes the switch 54 to open and the switch 56 to close, thus causing the Gated Clamp 57 to operate.

The switching actions shown in FIG. 5 are actually actions performed by means of CMOS digital logic.

SYNCHRONIZATION SLICER

Figure 1C:
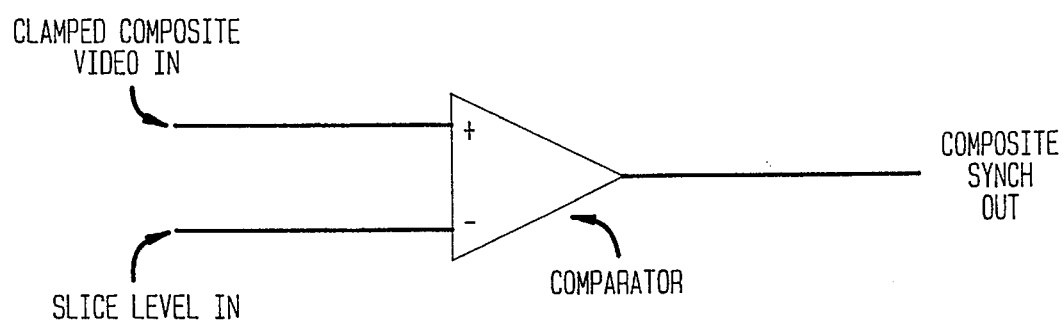
Figure 1D:
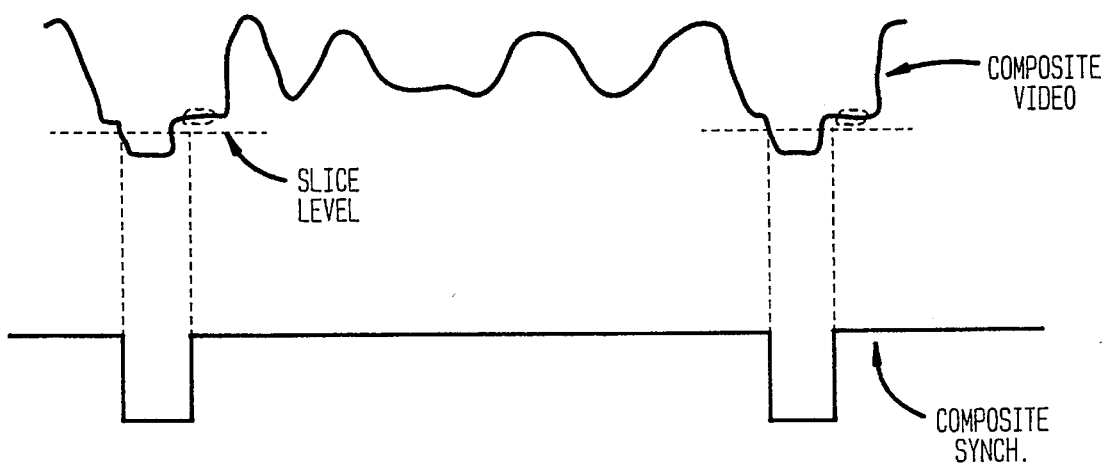

In prior art arrangements, the composite video signal is clamped to the clamp voltage Vc and applied to one input of a comparator, such as was described in the context of FIG. 1c. The slice level voltage is applied to the other input of the comparator. If the video signal is a standard video signal of unvarying amplitude, then a fixed d.c. slice level voltage equal to the average value of the synchronization tip and porch levels is used. The composite synchronization appears at the output of the comparator.

An alternate method, called an adaptive synchronization slicer, is used in prior art circuits for a video signal which varies in amplitude. In an the adaptive slicer, the synchronization tip and the porch voltages are separately sampled, the difference between them is halved and added to the synchronization tip voltage, thus creating an average value synchronization slice voltage which adapts according to the video, or synchronization tip amplitude.

IMPROVED SYNCHRONIZATION SLICER

Figure 6A:
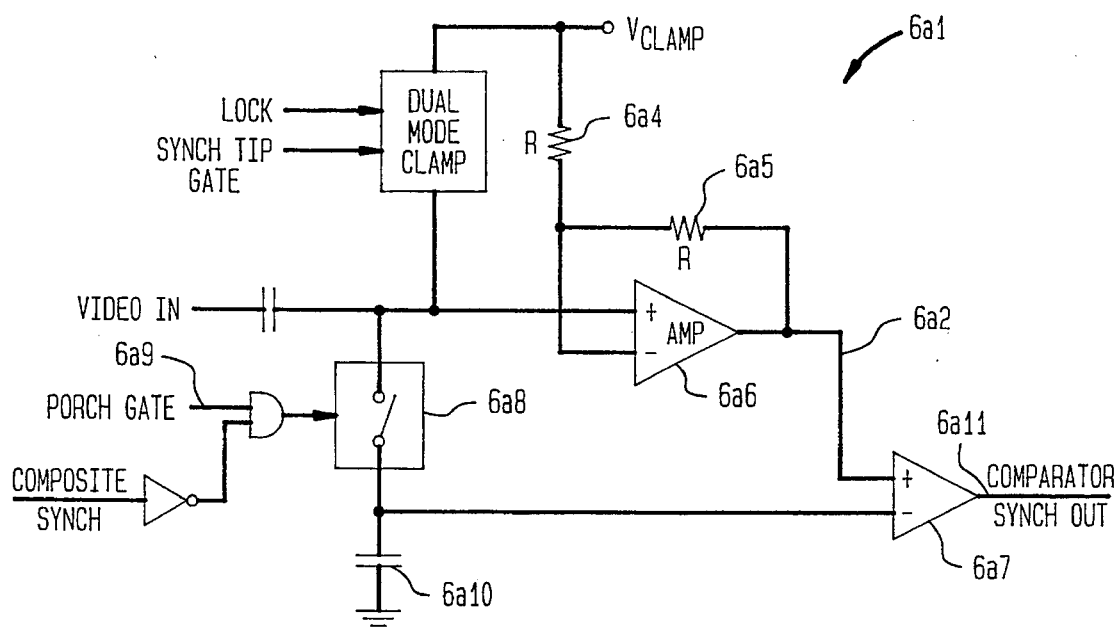
FIG. 6a is a schematic circuit diagram of a novel synchronization slicer useful in the circuit of FIG. 2.

A schematic of an improved synchronization slicer 24 of the circuit 21 of FIG. 2 is the slicer 6a1 shown in FIG. 6a. As previously noted with regard to the prior art synchronization slicer, there the adaptive slice level voltage was obtained by finding the synchronization tip voltage peak-to-peak amplitude, or synchronization tip height, halving it, and adding it to the synchronization tip voltage level. The main feature of the improved synchronization slicer 6a1 is that instead of halving the synchronization tip height, the full synchronization tip height is used as the slice voltage level for one input to the synchronization slicer, and double the amplitude of the clamped video voltage is used for the second input of the synchronization slicer.

Figure 6B:
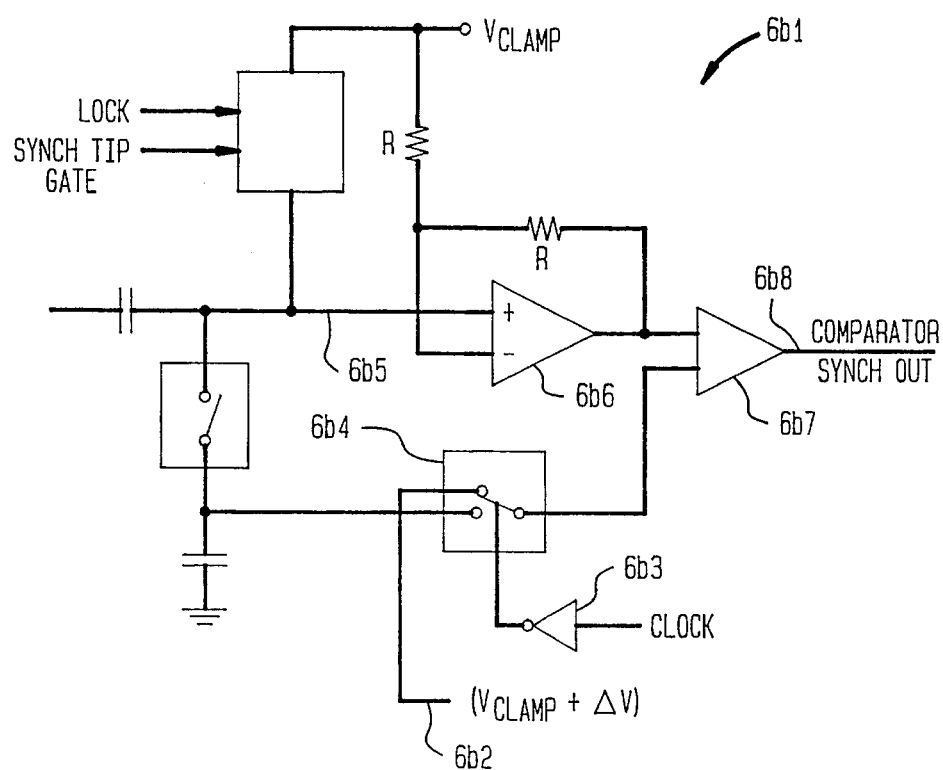
FIG. 6b is a schematic representation of another, dual-mode synchronization slicer also useful in the circuit of FIG. 2.
Figure 6C:
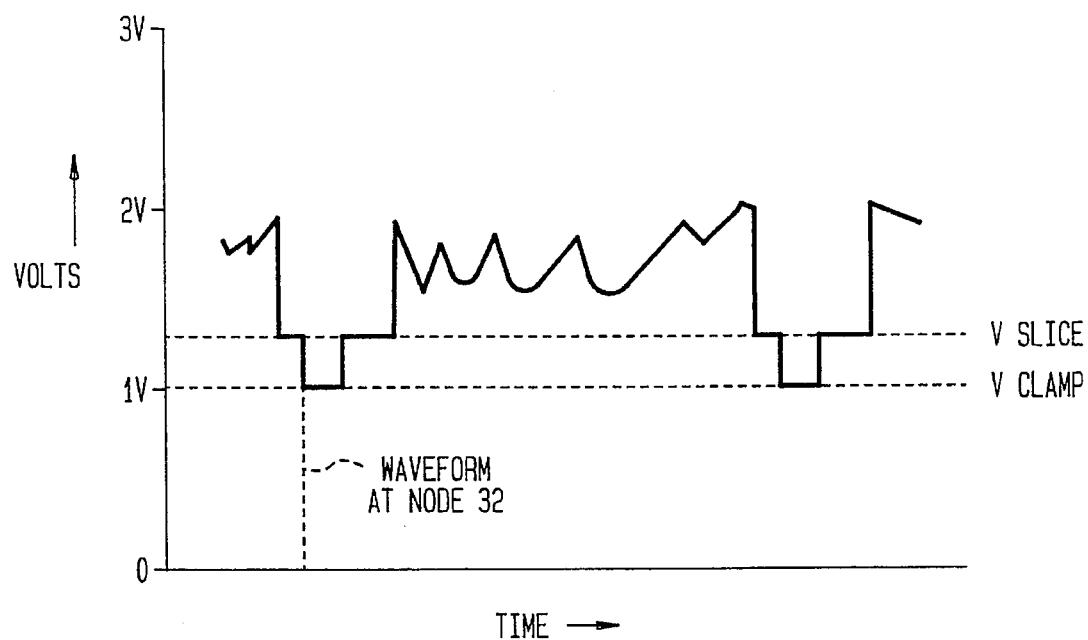
FIGS. 6c and 6d are diagrammatic representations of a clamped video and gain-of-two amplifier of the circuit of FIG. 2, showing slice voltage levels.
Figure 6D:
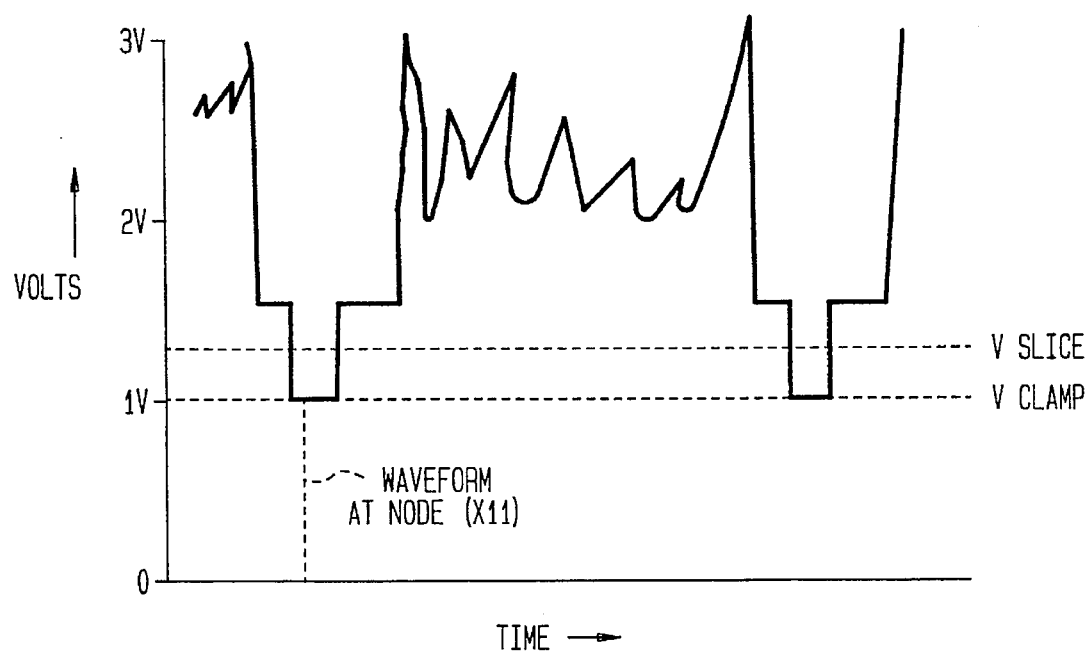

The clamped video and the double amplitude clamped video voltage relationships are depicted in FIG. 6c and 6d. It is important to note that the slicer 6a1 is configured such that the synchronization tips of both the clamped video 6a2 and the double amplitude clamped video 6a3 are at the same clamped d.c. level, Vclamp. This result can be achieved by various means. The method shown in FIG. 6a is that where the voltage divider formed by resistors 6a4 and 6a5 for setting the gain of the operational amplifier 6a6 and comparator 6a7 is returned to Vclamp. The voltage divider 6a4,6a5 is used to set the gain of the amplifier 6a6 to precisely two.

The slice level is obtained by sampling and holding the back porch voltage level of clamped video node 6a2 with the Gated Clamp 6a8, controlled by porch gate 6a9, charging and storing the voltage level in capacitor 6a10. This voltage is applied to one input of the synchronization slice comparator 6a7 and the clamped double amplitude video is applied to the second input. The composite synchronization is obtained at the output 6a11 of the comparator 6a7.

DUAL-MODE SYNCHRONIZATION SLICER

As is the case for the dual-mode clamp 51, the slicer 24 of the circuit 31 of FIG. 2 is a preferably a dual-mode device, shown as the slicer 6b1 in FIG. 6b. It starts in an inferior mode and switches to a superior mode once synchronization has been acquired. The circuits 6a1 of FIG. 6a and 6b1 of FIG. 6b are similar, except that the circuit 6b1 in FIG. 6b uses a slice level 6b2 which is delta V above Vclamp for start-up. Delta V is a voltage approximately equal to the lowest expected input video synchronization tip height. Once synchronization is acquired, the lock control signal 6b3 causes switch 6b4 to connect the stored back porch level of the clamped input video to one input of the voltage comparator. The input signal 6b5 is amplified in an amplifier 6b6 with a fixed gain of two and applied to the other input of the voltage comparator 6b7. The composite synchronization is obtained at the output 6b8 of the comparator 6b7. The advantage of this approach is that the slice level is placed exactly in the center of the synchronization pulse by the action of the gain of two amplifier, no matter what the signal level. Furthermore, it is particularly advantageous that a gain of two can be accurately established in a CMOS environment.

DATA SLICER

Figure 7A:
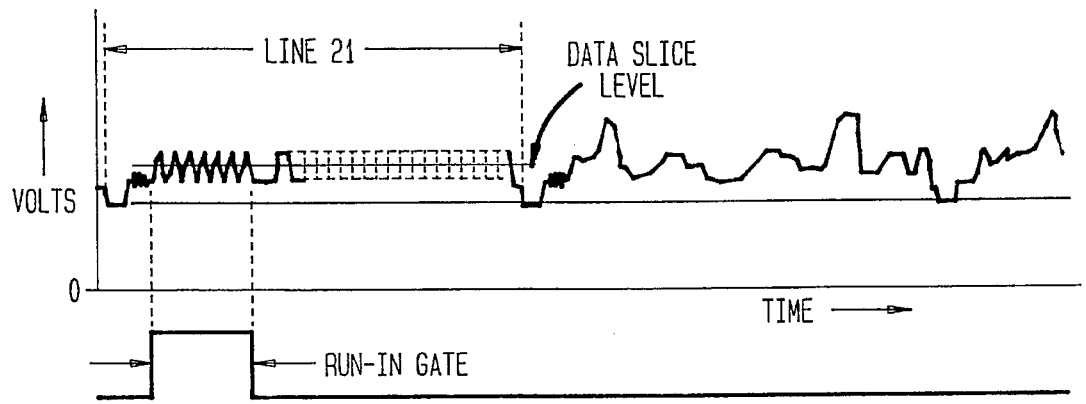
FIG. 7a is a diagrammatic prior art representation of a line video waveform, showing the data slice voltage level.

Data slicing is a process whereby a digital form of data is extracted from an analog signal upon which data has been superimposed. For example, FIG. 7a shows a graphic representation of line 21 of a video signal and the relative timing of the run-in gate 7a1. FIG. 7c depicts a schematic of a prior art circuit 7c1 by which the closed caption data can be extracted from line 21. Video is applied to one input of a comparator 7c2 and a d.c. slice level is applied to the second input of the comparator 7c2.

In the circuit 7c1 shown in FIG. 7c, an electronic switch 7c3 connects the discrete component integrator R and C to the video signal during the run-in burst via the run-in gate 7c4. The output of the integrator R and C is a sample-and-hold voltage of the average d.c. value of the run-in burst which serves as the above slice level.

Figure 7B:
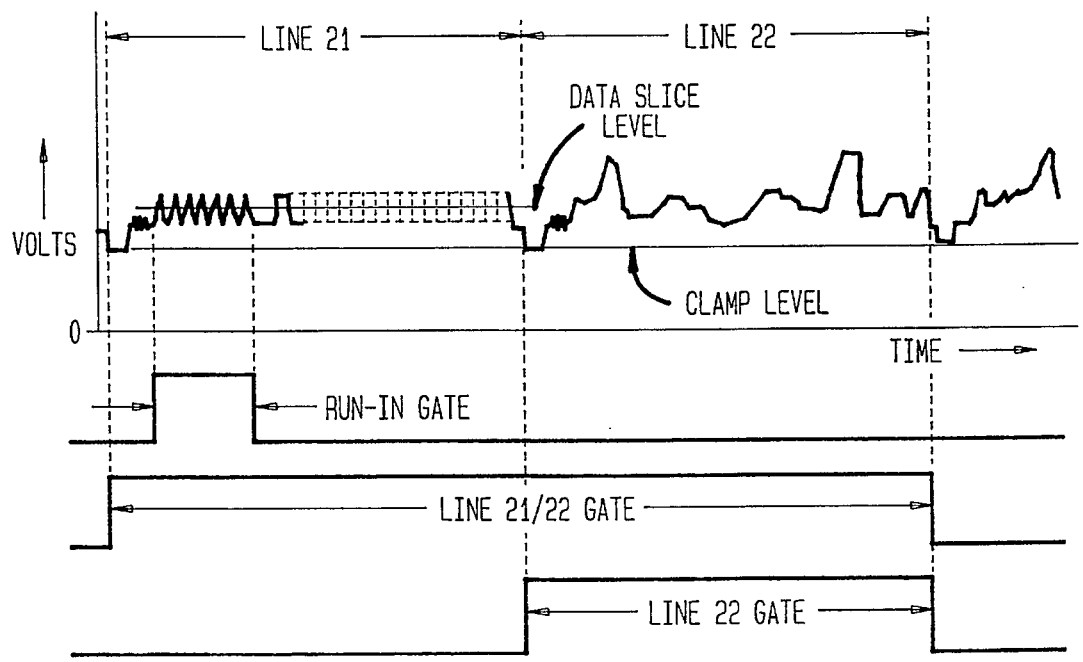
FIG. 7b is a diagrammatic representation of the line 21 video waveform of FIG. 7a, showing also the gate timing for the novel data slice circuit.
Figure 7C:
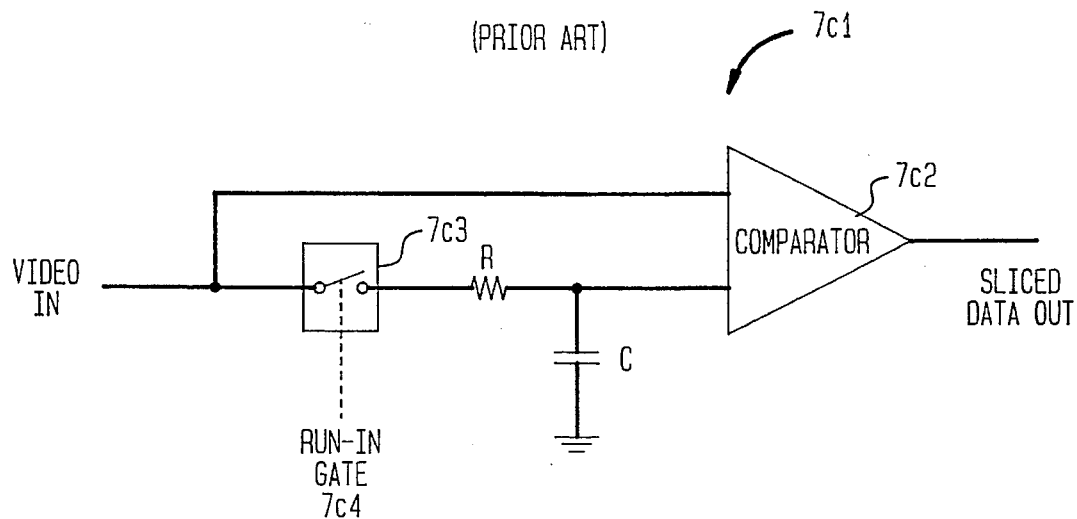
FIG. 7c is a schematic circuit diagram of a prior art data slicing circuit.
Figure 7D:
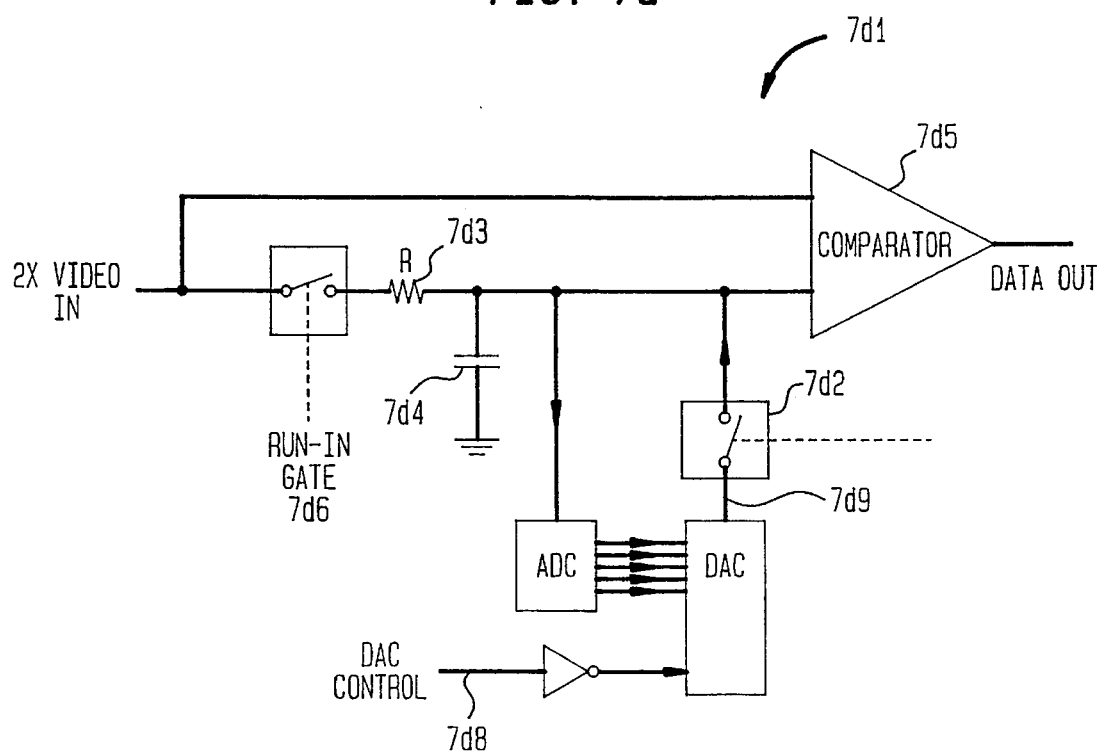
FIG. 7d is a schematic circuit diagram of a novel data slicer useful in the circuit of FIG. 2.

FIG. 7d shows a novel circuit 7d1 useful as the DATA SLICER 25 in the extraction circuit 21 of FIG. 2 for performing the data slicing function. All the components shown are producible in the CMOS technology. The components, i.e. the electronic switch 7d6, resistor 7d3, capacitor 7d4, and the comparator 7d5 perform functions similar to those corresponding components in the description for the circuit in FIG. 7c. The holding switch 7d6 can be designed such that the resistor 7d3 is a parameter of the switch 7d6.

The novel circuit 7d1, which includes a digital to analog converter DAC and an analog to digital converter ADC, solves a problem which arises due to the low duty cycle and relatively long sample-and-hold time in which the held charge can leak off the capacitor C, especially at elevated temperatures. Another advantage is that the capacitor C is now incorporated on the chip, thereby removing a costly external pin and component and avoiding the leakage current associated with external components.

The operation of the novel circuit 7d1 can be seen by referring to FIGS. 7b and 7d. During the time when line 21 occurs, the circuit 7d1 operates as described in FIG. 7c, except that the output of the DAC/ADC is disconnected from the sample-and-hold capacitor C by means of the control gate source 7d2 controlling the holding switch 7d2.

The remainder of the circuit 7d1 operates as previously described. During line 22 (or any other reasonable time after line 21) the DAC control source 7d8 operates, causing the ADC/DAC to sample the voltage at the capacitor 7d4, causing capacitor 7d4 to adjust its output to the nearest increment of the output voltage of capacitor 7d4. After line 22 (or other reasonable time) the control source 7d8 turns off the ADC/DAC and switch 7d2 closes, applying the output 7d9 of the DAC to the capacitor 7d4, which holds the charge for the remainder of the video frame. The ADC/DAC, therefore, acts to supply current to the capacitor 7d4 to offset any circuit leakage current that may be present during the interval from line 22 to the next line 21. Upon the arrival of the next line 21, the output 7d9 of the ADC/DAC is disconnected from the capacitor 7d4, the sample-and-hold operates to make a correction for signal level, if necessary, and the process repeats.

In summary, In the setting of the slice level, if a small slice level storage capacitor were used for the level holding function, then its response to necessary adjustment would be rapid. However, due to inevitable leakage of such a device, it would not be able to hold the slice level sufficiently constant over such a long period of time as elapses between line 21 occurrences. The use of an external capacitor in the CMOS implementation would require a very low leakage component. Also terminal pins are at a premium and are also a source of noise into the circuit. In addition each pin is connected to protection diodes which inevitably have significant current leakage. This leakage leads a capacitor connected to a pin to experience voltage "droop" during the storage time interval. While the droop can be reduced by increasing the capacitance value of this capacitor, thus increasing the time constant, that would makes it difficult or impossible to then rapidly adjust the slice level during line 21, as would be required when code amplitude variations are encountered.

The only error present with the use of the circuit 7d1 is due to the granularity of the ADC. This may be determined in advance with appropriate design of the ADC to be less than the required tolerance for the slice level. Because with the circuit 7d1 the slice level capacitor 7d4 can be made very small, it can be integrated on the chip and have a fast response time while nevertheless holding the slice level accurately to the degree desired. Any inaccuracy will be adjusted for during the next occurrence of line 21 run-in. It is noted that while the circuit 7d1 is in a sense highly complex in terms of the number of active devices present in the ADC and the DAC, and in this respect is quite different from the type of circuit which has been traditionally used for such a function in video circuits, in the environment of a CMOS circuit, such complexity is readily available with little added cost to the integrated circuit chip because once the circuit has been designed, the manufacturing cost is, within limits, largely independent of the number of active devices which are present in the circuit. Such an approach to this function within the context of a television receiver circuit is believed to be a significant departure from prior art approaches.

DATA CLOCK RECOVERY

Data clock recovery requires the internal generation of a clock signal which is used to sample incoming line 21 data bits at appropriate points away from data transition edges. In the novel circuit 21 of the present invention, clock recovery is achieved by using a closed loop digital phase adjustment technique to control the phase of a 32H (32 times horizontal) rate counter clocked by a signal which is frequency-locked to the horizontal component of the input video waveform. This novel technique eliminates several problems encountered in previously implemented methods. Firstly, the technique requires only easily implemented digital logic circuits, eliminating the need for more complex analog phase locked loop circuits. Secondly, the circuit performance in the presence of noise on the input video waveform is enhanced by allowing the phase position of the data clock to adapt more slowly than would be practical in an analog phase-locked loop implementation.

Figure 8:
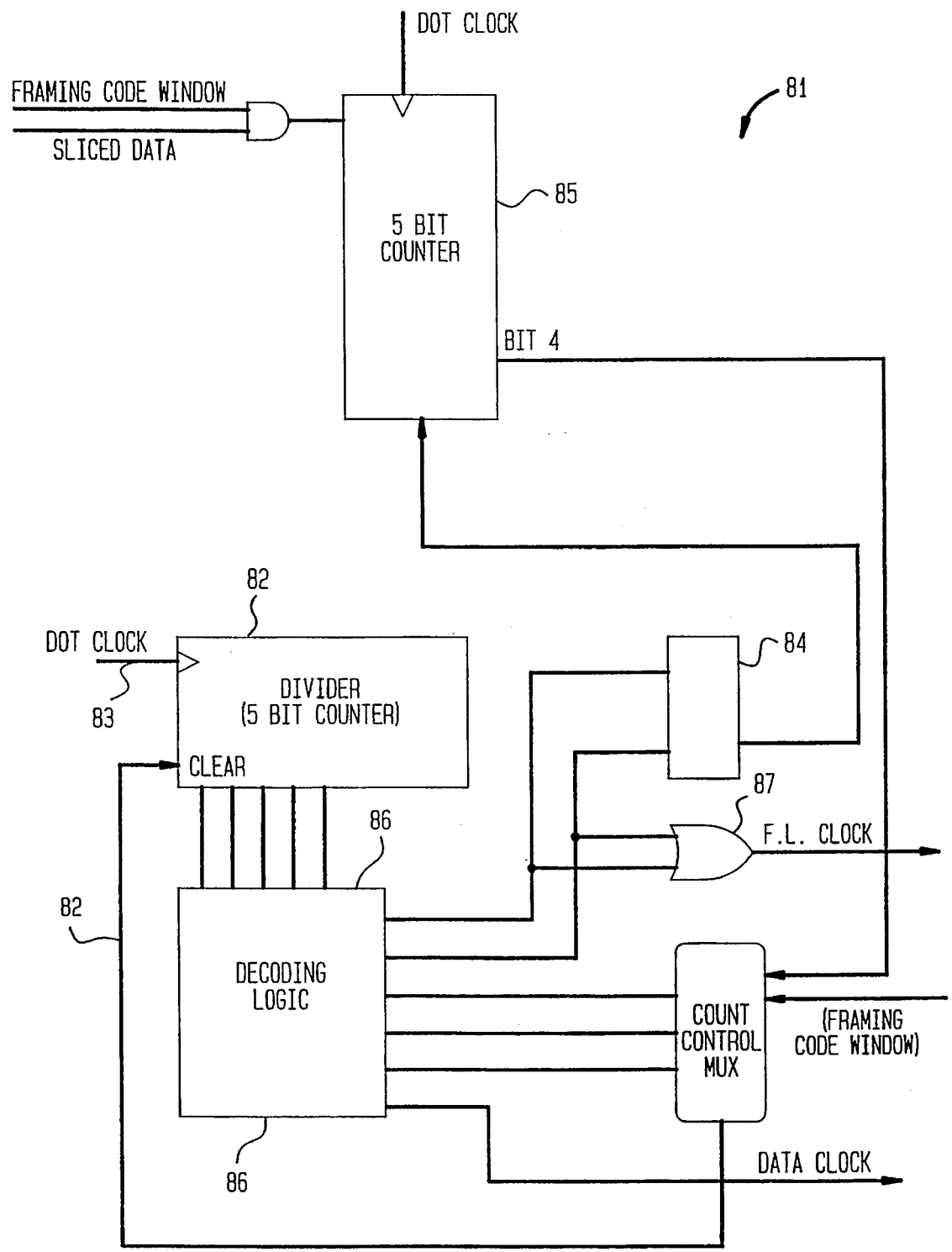
FIG. 8 is a schematic circuit diagram, in block form, of a novel data clock recovery circuit of the circuit of FIG. 2.

Referring to FIG. 8, there is shown a preferred version of the DATA CLOCK RECOVERY 26 of the circuit 21 of FIG. 2 in the form of circuit 81, in which the 32H signal is generated by applying the video dot clock pulses, which are the output of the VCO at node 82, to a 5 bit counting programmable divider 83. This divider 83 is capable of dividing the clock by 23, 24 or 25. A count of 24 produces the 32H clock. If the divider 83 is made to overflow at 23, then the phasing of the internal clock with respect to the clock run-in moves earlier in the cycle. If the divider 83 is made to overflow at 25, the phasing of the internal data clock moves later in the run-in cycle. This allows the phase to be brought into lock with the clock run-in within plus or minus one dot clock resolution. Since only a resolution of approximately 3 dot clocks is required for high performance operation, this limitation in phase lock resolution does not degrade circuit performance.

The line 21 clock run-in component of the incoming waveform is used as the phase reference for the internal data clock. The phase steering to the data clock divider 83 is provided by a phase comparison technique which produces a binary error signal indicating whether the center of the positive half-cycle of each of the clock run-in cycles is leading or lagging the positive edge of the data clock. The reference clock 84 generates a 50% duty cycle pulse train derived from the data clock divider 83 by decoding its rising and falling edges. The lead/lag detect is accomplished with a separate counting circuit 85 which counts on each video dot clock, conditional on the presence of a 1 level on the data input. This counting circuit 85 is forced to count up on dot clocks before the rising edge of the reference clock and down after the rising edge. The accumulated count at the falling edge of the reference clock, i.e. either greater than 0 or less than 0, determines the phase steering for the next reference clock cycle. This counting circuit 85 is cleared synchronously with the falling edge of the reference clock to prepare it for the next cycle. This phase steering process is enabled only during the part of the line 21 waveform which contains the clock run-in signal. At all other times the dot clock divider 83 is set to a count of 24, which preserves its phase in respect to the clock run-in. This digital phase lock eliminates the VCO droop and consequent loss of lock that would occur between frames in a conventional analog phase locked loop implementation. The data clock is then decoded from the synchronized data clock divider by circuit 86. A decoding which leads the reference clock rising edge by 6 video dot clocks is used. The resulting data clock is ideally positioned to sample the line 21 data. The reference clock falling edge decode of the data clock divider 83 is logically OR'd with the reference clock rising edge decode by circuit OR circuit 87 to provide a double rate clock for sampling of the clock run-in and start bit to obtain the framing code bits.

VCO AND HORIZONTAL LOOP

Once the horizontal synchronization has been accurately detected as described above, it becomes necessary to synchronize the internal timing signals to it in both frequency and phase. In a first, common approach for accomplishing the synchronization, there is provided a high frequency VCO which has its frequency set to the desired center frequency of the signal. This signal is divided down to horizontal synchronization signal frequency to permit a phase comparator to send a control voltage to the VCO to correct and lock in the phase. Circuits which use digital phase/frequency comparison techniques do not require very stable VCO's, but the nature of the edge-triggered logic networks which perform the phase and frequency steering result in very poor noise immunity. In a second approach involving sampled-phase comparator type circuits, there does result the desired noise immunity capability, but such circuits require tight VCO performance specifications and tend to produce static phase error.

A much more serious difficulty with the above approach as regards the extraction circuit 21 of FIG. 2 is that it is not feasible in CMOS technology to provide an on-chip oscillator with an accuracy anywhere near the 1% which would be needed for the VCO of the second approach described above. The accuracy of CMOS oscillators is more in the range of 30%. Therefore, a different and novel approach has been taken in the circuit of FIG. 2 for accomplishing horizontal frequency and phase locking.

Figure 9:
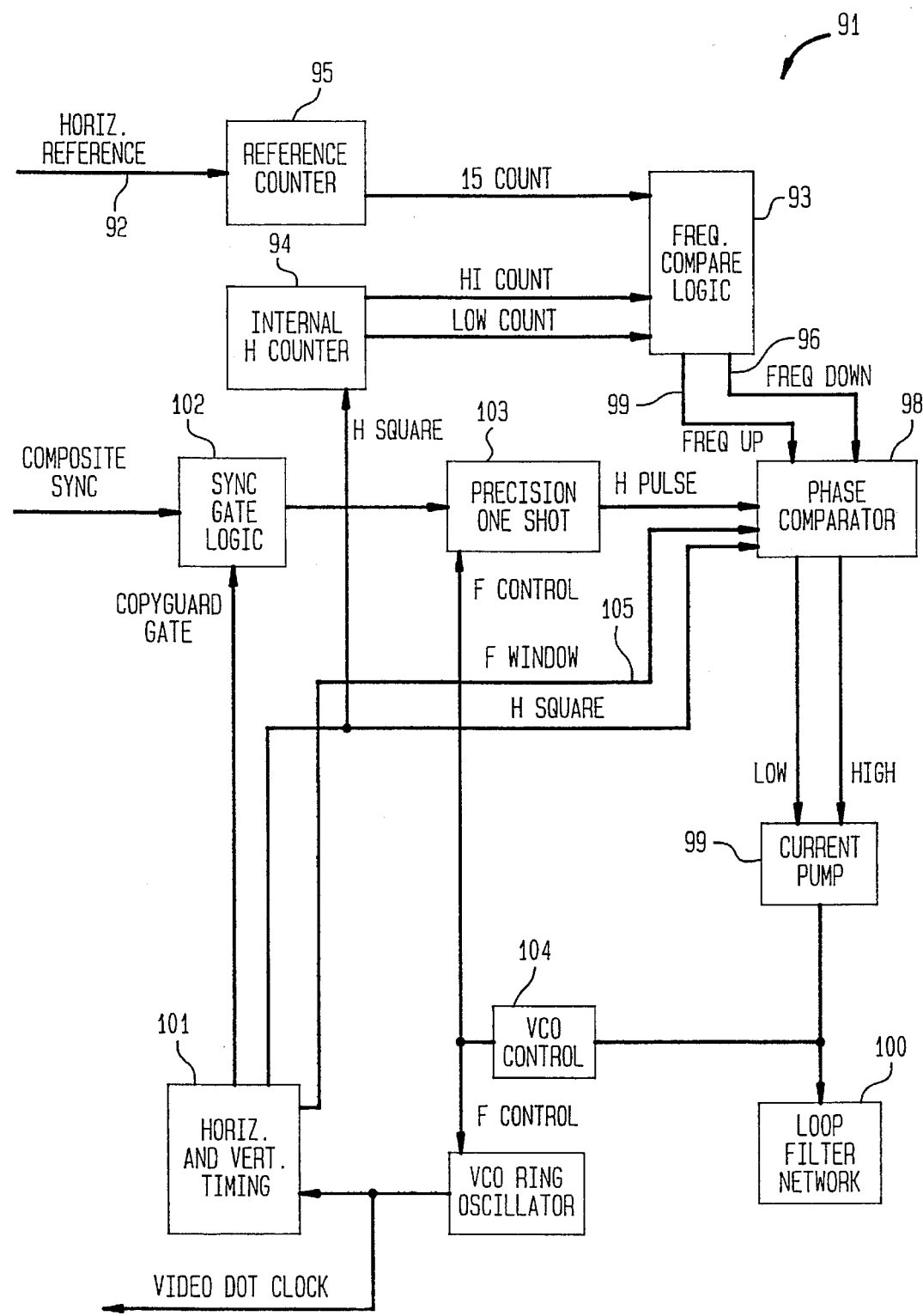
FIG. 9 is a schematic circuit diagram, in block form, of a novel phase and frequency locking circuit of the circuit of FIG. 2.

FIG. 9 is a block diagram of a novel implementation 91 of the VCO 27 and H LOOP 28 (Horizontal Loop) circuit portions of the circuit 21 of FIG. 2 which does not require a stable VCO, but still provides good noise immunity, no static phase error, and is easily implemented in a CMOS environment. The circuit 91 starts out with a high frequency clock at node 92 generated by a non-precision VCO. This clock is counted down to pulses of the same frequency as the horizontal frequency of the video waveform and is held within precise frequency and phase of the horizontal component of the input video waveform by means of a PLL (phase-lock loop). This PLL utilizes a phase comparator which has a high immunity to video waveform noise, but suffers from a relatively narrow frequency pull-in range. Pull-in over a wider range is accomplished by the inclusion of a parallel-connected frequency comparator which steers the VCO whenever the frequency of the counted down VCO output differs from the frequency of an externally supplied reference frequency by a fixed proportion. The frequency comparator serves to hold the VCO frequency within a fairly narrow window. When the VCO frequency is within this range, the frequency comparator provides no steering of the loop. This range is designed to be well within the pull-in range of the phase comparator, which will then pull the VCO into precise phase and frequency lock. It is important to note that the externally supplied horizontal frequency reference at node 92, typically a horizontal flyback signal in a television receiver application, does not need to be precise in frequency or have a known phase relationship to the input video signal. This signal could typically vary by plus or minus 5% without having any effect on system performance.

Referring now to FIG. 9, the horizontal frequency comparator 93 counts the number of divided VCO clocks received from the Internal H Counter 94, which occur in a 16 video line time window created by counting horizontal frequency reference clocks. When the Reference Counter 95 has counted 16 reference pulses, it sends a pulse to the frequency comparator 93 which causes the state of its frequency-down and frequency-up control signals at nodes 96,97 to be set for the next 16 reference pulse window. These control signals are set dependent on the count achieved by the Internal H Counter 94 at the time the Reference Counter 95 has reached a count of 16. If the low count, typically 14, has not been reached, the frequency-up signal is driven high, and the frequency-down signal is driven low for the next 16 lines. If the high count, typically 18, has been reached, the frequency down signal is driven high and the frequency up signal is driven low for the next 16 lines. If the low count has been reached and the high count has not been reached, both the frequency up and frequency down signals are driven low for the next 16 lines. The frequency-up and frequency-down signals are used by the Horizontal Phase Comparator 98 to steer the VCO control voltage to keep the VCO frequency within approximately 10% of the input reference frequency.

The horizontal phase comparator 98 provides the VCO control steering to pull the oscillator into phase lock. In a captioning data recovery application, it is important that the static phase error of the horizontal loop is small, typically less than 0.5 microseconds, to insure that the H-related windows for determining slice levels and the gated clamp are precisely positioned. Since only a non-precision VCO is available in a CMOS implementation and static phase error is directly proportional to the difference between the poorly-controlled center frequency of the oscillator and the desired H frequency in a conventional horizontal AFC (automatic frequency control) loop, it is necessary to develop a new approach. The horizontal phase comparator 98 eliminates the static phase error of conventional circuits by integrating the phase error through the use of the current pump 99 and loop filter network 100. Since no error current is required to maintain the VCO at frequency, it is not necessary for a phase-error to exist to maintain this error signal. The remaining static phase error in lock is very small and is due to leakage on the nodes and non-linearities in the current pump 99.

The horizontal phase comparator 98 of the circuit 91 is relatively simple in operation. The signal HSQUARE is derived from the horizontal and vertical timing logic source 101. This signal is a 50% duty cycle horizontal frequency pulse train with its rising edge positioned at the internal H count associated with 0.6 microseconds after the leading edge of H synchronization. The composite synchronization signal from the synchronization slicing circuit is used to generate a second signal, HPULSE. First the composite synchronization is gated in the synchronization gate logic source 102 with a signal COPY GUARD GATE derived from the horizontal and vertical timing source 101. This signal masks out the synchronization signal during areas of the vertical retrace and vertical blanking interval outside of the portion of the video line in which the horizontal synchronization is positioned. This gating serves two functions. Firstly, it eliminates interference from copy-protected video sources which often have extra synchronization pulses inserted in these portions of the video waveform. Secondly, it prevents the horizontal loop from being steered off-frequency by the equalizing and vertical pulses, thereby eliminating a phenomenon known as "top hooking".

The gated composite synchronization is used to trigger a precision one-shot circuit 103 to produce a pulse of known precise width, typically 1 to 2 microseconds. This signal, HPULSE is used in lieu of the actual horizontal pulse for two reasons. Firstly, the width of the sliced synchronization pulse is imprecise and subject to variability in generation, transmission, band limiting and slicing. Secondly, the width, approximately 4.8 microseconds, is overly large and creates an inconveniently large, 2.4 microsecond phase difference between HSQUARE and the leading edge of the synchronization pulse.

Since any uncertainty in the one-shot pulse width would create static phase error and would effect the loop dynamics, it is essential that its width be well controlled. It is not practical in CMOS technology, however, to create precise delays using conventional techniques without requiring precision external components. Because of this, a novel technique is employed in the circuit 21 which uses a controllable one-shot circuit 103 which is matched to the VCO 104 and shares its control voltage, so that the one-shot width is precisely determined at lock. Although many one-shot circuits could be developed which would be matched to the on-chip VCO performance, the novel one-shot circuit 103 is particularly accurate and well-controlled. It employs a second VCO, identical in design to the H loop VCO and sharing its control voltage. Due to the high degree of matching in monolithic CMOS circuits, this second oscillator is virtually identical in frequency to the H loop VCO. The output of this oscillator drives a fixed counter which produces an output signal when a predetermined count is reached. This count is equal to the desired one-shot width, divided by the dot clock period. This second oscillator is held in reset until the leading edge of the gated composite synchronization arrives. The HPULSE is then driven high until the counter times out. To improve noise immunity, the HPULSE will also go low if the gated composite synchronization goes low before the timeout (completed count) has occurred. The counter resets after timeout, and the one-shot oscillator remains in reset until the next H synchronization leading edge.

The outputs of the frequency comparator 93 control the action of the phase comparator 98. This digital circuit enforces simple priority rules to determine the action of the current pump 99. If frequency steering is requested by the frequency comparator 93, as evidenced by a high logic level on the FREQUP or FREQDOWN signals of nodes 97,96, then the selected polarity current pump is activated during the FWINDOW timing window of node 105 in each video line. The FWINDOW is true for only a portion of the line, and is used to control the magnitude of frequency steering. A FREQUP signal will cause a constant pull-up current to be applied to the loop filter node, and a FREQDOWN signal will cause an equivalent pull-down current to be applied. If both FREQUP and FREQDOWN are false, no current will be sinked or sourced from the loop filter network 100, except by the action of the phase comparator to be described next. The phase comparator 98 causes the current pump 99 to sink or source a fixed current from/to the loop filter network 100 whenever HPULSE is true. The polarity of the current is determined by the state of the HSQUARE timing signal of node 106. When HSQUARE is high, current is pulled to the positive supply. When HSQUARE is low, current is pulled to ground. At lock, HSQUARE is low for the first half of HPULSE and high for the second half.

VERTICAL PULSE DETECTION AND COUNTDOWN SYNCHRONIZATION

An additional requirement for recovering data from the television signal is the ability to properly identify the data to be processed. This can be done by recognizing a unique pattern in the data, locating the raster line containing that data, or a combination of both of these techniques. When pattern recognition cannot be used, because more than one line may have the same format, as in the case of Line 21 Closed Captioning, only line identification is possible.

Raster line identification requires the ability to synchronize to the vertical rate. The incoming signal contains a vertical synchronization pulse which can be extracted in a straightforward manner. One approach to detecting the vertical pulse has been to use a capacitor as an accumulator for synchronization pulses from the composite synchronization signal and to then use a voltage detector for sensing when the vertical pulse should be generated. Such an arrangement is vulnerable to noise and is not very feasible in a CMOS integrated circuit because it requires a rather large, good quality capacitor. Such a component would have to be located separately off-chip. In order to avoid these problems in the extraction circuit 21 of the present invention, vertical pulse detection is accomplished digitally within the circuit by means of novel counting circuits.

To further improve the noise performance, there is provided a means for counting down from the now highly accurate horizontal synchronization pulses to generate a noise-free vertical signal. This is then synchronized to the vertical pulse detected from the incoming video. Noise or other pulses which could look like vertical synchronization pulses, but which occur at other times, are disregarded.

Figure 10:
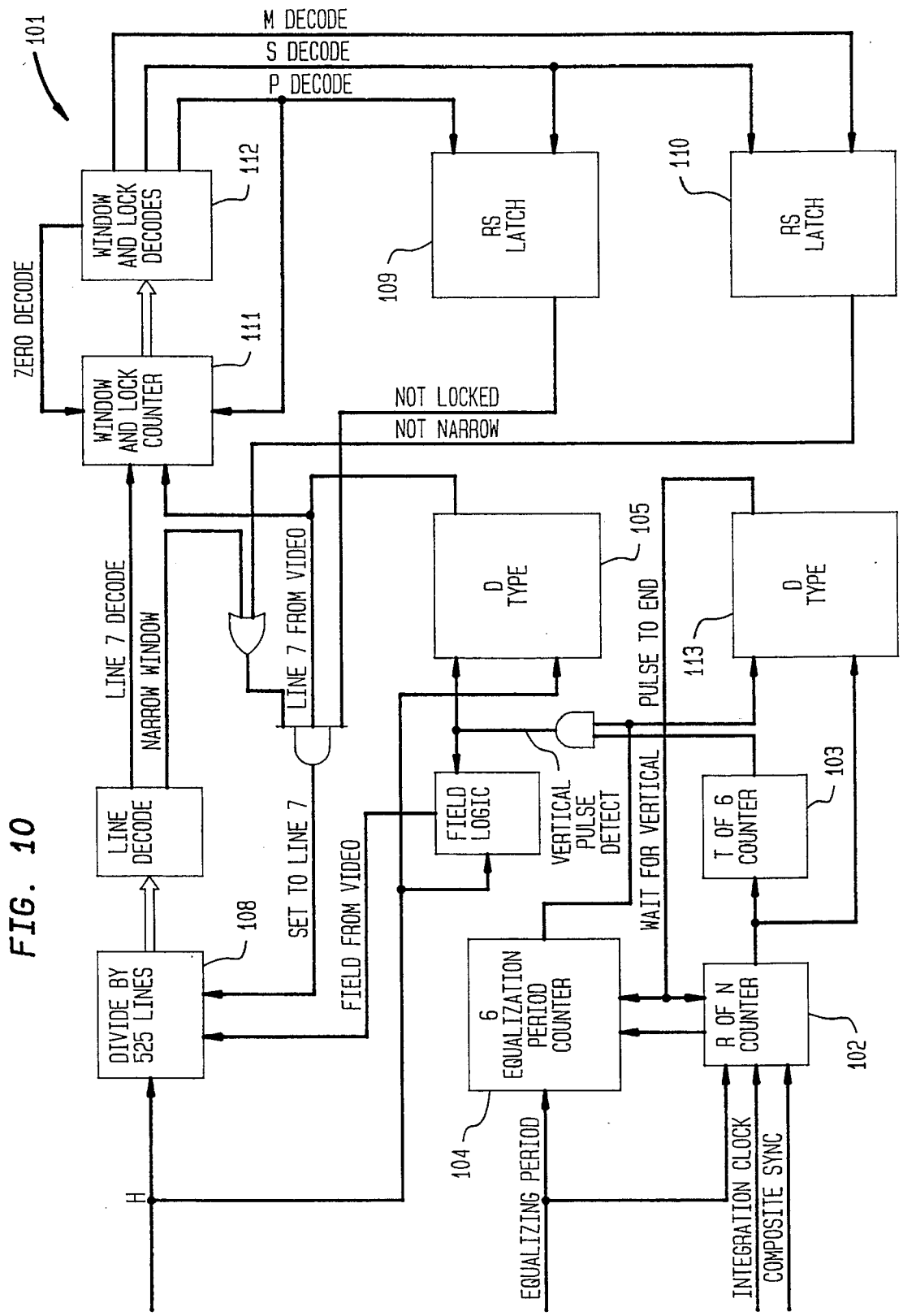
FIG. 10 is a schematic circuit diagram, partially in block form, of a novel vertical pulse detection and countdown synchronization circuit of the circuit of FIG. 2.

FIG. 10 is a block diagram of an implementation of the VERTICAL COUNTER AND CONTROL CIRCUIT 29 of the circuit 21 of FIG. 2 in the form of the circuit 101. In part, it determines the occurrence of the vertical pulse in the incoming signal and also identifies the field. In the circuit 101 in accordance with the invention, this time interval is measured by digital integration. This approach is advantageous in that it is insensitive to distortions in the vertical pulse interval. It is noted, for example, that while the broadcast composite signal vertical pulses have serrations, those from a VCR (video cassette recorder) have none. Thus, these two signals may have different effects on a conventional integrator. The digital integrator of the circuit 101 is immune to such differences, but sees only horizontal synchronization pulse events.

The occurrence of the vertical pulse is translated into a line 7 signal by digital integration. In the R of N counter 102, each equalizing period of the vertical pulse is sampled n times, and the number of times which the composite synchronization is high during the sample is accumulated (count r). If the count r exceed a minimum number, that equalizing period is determined to be a vertical pulse time. The number of equalizing periods passing this test is accumulated as count t in the T of 6 Counter 103. If the count t reaches a specified minimum value when the 6 equalization period counter 104 is done, then the next horizontal line pulse is set to be the start of line 7 by the D Type flip-flop circuit 105. At the same time, the field is identified in the field logic circuit 106 by determining whether the six consecutive pulses have occurred on an H edge, field 1, or an equalizing pulse edge, field 2.

Once the six consecutive count period has been completed, the RS (reset) latch flip-flop circuit 113 will prevent it from restarting until the R of N counter 102 has produced a zero output to signify an end to the vertical pulse period. This is important to eliminate any spurious line 7 counts which would occur if a long, non-standard vertical pulse period should occur, as may be the case in some VCR-generated signals.

The decision threshold used for count r determines the noise immunity associated with this integration process. The same is true for the threshold used for count t. If the number used is too low, the circuit would be vulnerable to additive noise pulses. Conversely, if the number is too high, it would be vulnerable to subtractive noise pulses. In this embodiment, count r has been set to 15 for a total sample rate of n=24. Count t has been set to 5.

The vertical countdown generated in the Divide By 525 Lines circuit 108 internally replicates the line and field counts of the incoming video signal and, along with the Line Decode logic 109, is used to determine all line rate timings, including vertical pulse position and line identification required for data recovery and display. The synchronization of the vertical countdown to the incoming video is controlled in three modes. If the two RS Latches 107 and 110 are reset, then the vertical countdown circuit is in unlock mode and is running "pulse for pulse", where the vertical countdown is slaved to the vertical pulse derived from the incoming video. Each time a vertical pulse is detected, even if it were erroneous, the vertical countdown is synchronized to it. When the RS Latch 110 is set, the circuit is in narrow mode and is slaved to the video as in the unlock mode, except that vertical pulses detected from the video outside a window around the internal vertical pulse are ignored. When RS Latch 110 is set, the vertical countdown circuit is in a locked mode and is running as a "flywheel" in step with the incoming video signal on a line-for-line basis, only checking the position of the vertical pulse from the incoming video to determine if synchronism has been lost.

The line 7 signal from the D Type 105 is used to set the Divide By 525 Lines circuit 108 into vertical phase. The state of the vertical countdown circuit is compared to line 7 in the Window and Lock Counter 111 to determine if the countdown circuit has remained in phase-lock from one field to the next. When the system first begins operation, every line 7 pulse is allowed to reset the countdown circuit. This is pulse-for-pulse operation, a non-noise-immune condition. If the Window and Lock Counter 111 and Window and Lock Decoder 111 and 112 detect that the two counts stay in phase for 'm' successive fields, then the RS Latch 110 is set, and the vertical countdown circuit is in narrow mode. The window for allowing the line 7 pulse to reset the countdown circuit is narrowed to about 6% of the field, greatly improving the noise-immunity of the circuit. The Window and Lock Counter 111 continues counting successive phase lock conditions. When a count of 'p' is decoded in the decode logic of the Window and Lock Decoder 112, then the countdown reset window is closed, so that it is operating in the "flywheel" mode with maximum noise immunity. This condition sets the RS Latch 107 into the 'lock' state, which is used in the dual clamp circuit and elsewhere. While in lock, the vertical phase is still monitored by the Window and Lock Counter 111 and the Decoders 111 and 112, but now is used to determine loss of phase lock. If these circuits detect that phase lock is lost for 's' successive fields, the lock state is discontinued, and pulse-for-pulse operation is resumed In this implementation 'm', 'p' and 's' have been set to 4, 8 and 4 respectively This ability to determine a change in the video signal by detecting the loss of lock provides a novel solution for erasing the display when a television channel is changed, without the need for access to an external signal from the receiver's tuner circuits.

GENERAL CONSIDERATIONS

The above-described circuit 21 of FIG. 2, is particularly useful for processing composite video signals in CMOS technology. However, its usefulness is not limited to such an environment, and all or only some of the novel features of the circuit may be used in virtually any desired circuit technology for virtually any type of signal. The high degree of noise immunity, together with the fast timing extraction performance of the circuit for indeterminate waveforms makes it especially suitable for information communicated over electrical power lines or other environments with a relatively high impulse noise level.

What is claimed is:

1. A circuit for phase locking an internal timing signal to an external signal, comprising:

a phase-locked loop including a phase comparator circuit and a voltage controlled oscillator, said phase comparator circuit receiving as inputs a signal derived from said voltage controlled oscillator and a signal derived from said external signal;

means for comparing the frequency of a reference signal to the frequency of a signal derived from said internal signal, and for generating a steering signal that depends on said comparison;

means for applying said steering signal to said phase-locked loop;

said means for comparing frequency comprising a frequency comparison logic circuit that compares counts derived from said reference signal and counts derived from said phase locked loop, and produces said steering signal in response to said count comparison, said steering signal being coupled with said phase comparator to influence operation of said phase locked loop;

said phase locked loop including a current pump that is coupled to the output of said phase comparator circuit, said steering signal being operative to control the current generated by said current pump; and means for deriving an output signal from said phase locked loop.

2. The circuit as defined by claim 1, wherein said current pump is operative to integrate the output of said phase comparator circuit.

3. The circuit as defined by claim 1, wherein said phase locked loop includes a one-shot circuit coupled between said external signal and said phase comparator circuit, said one-shot circuit being matched to the voltage controlled oscillator of said phase locked loop and being operative to track the timing of said voltage controlled oscillator.

4. The circuit as defined by claim 1, wherein said external signal is a sync signal derived from a received television signal.

5. The circuit as defined by claim 4, wherein said reference signal is an externally supplied horizontal reference signal.

6. A circuit for phase locking an internal timing signal to an external signal, comprising:

a phase-locked loop including a phase comparator circuit and a voltage controlled oscillator, said phase comparator circuit receiving as inputs a signal derived from said voltage controlled oscillator and a signal derived from said external signal;

means for comparing the frequency of a reference signal to the frequency of a signal derived from said internal signal, and for generating a steering signal that depends on said comparison;

means for applying said steering signal to said phase-locked loop;

said means for comparing frequency comprising a frequency comparison logic circuit that compares counts derived from said reference signal and counts derived from said phase locked loop, and produces said steering signal in response to said count comparison, said steering signal being coupled with said phase comparator to influence operation of said phase locked loop;

said phase locked loop including a one-shot circuit coupled between said external signal and said phase comparator circuit, said one-shot circuit being matched to the voltage controlled oscillator of said phase locked loop and being operative to track the timing of said voltage controlled oscillator; and means for deriving an output signal from said phase locked loop.

7. The circuit as defined by claim 6, wherein said external signal is a sync signal derived from a received television signal.

8. The circuit as defined by claim 7, wherein said reference signal is an externally supplied horizontal reference signal.

\* \* \* \* \*